United States Patent
Shi et al.

(10) Patent No.: US 12,047,098 B2
(45) Date of Patent: *Jul. 23, 2024

(54) DATA COMPRESSION TECHNIQUES

(71) Applicant: SAP SE, Walldorf (DE)

(72) Inventors: Jia Shi, Airdrie (CA); Reza Sherkat, Waterloo (CA); John Smirnios, Waterloo (CA)

(73) Assignee: SAP SE, Walldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/072,979

(22) Filed: Dec. 1, 2022

(65) Prior Publication Data

US 2023/0103328 A1    Apr. 6, 2023

Related U.S. Application Data

(63) Continuation of application No. 16/878,419, filed on May 19, 2020, now Pat. No. 11,558,067.

(51) Int. Cl.
*H03M 7/46* (2006.01)
*G06F 16/22* (2019.01)
*H03M 7/30* (2006.01)

(52) U.S. Cl.
CPC .......... *H03M 7/46* (2013.01); *G06F 16/2282* (2019.01); *H03M 7/3088* (2013.01)

(58) Field of Classification Search
CPC ..... H03M 7/3088; H03M 7/46; G06F 16/221; G06F 16/2282
See application file for complete search history.

(56) References Cited

U.S. PATENT DOCUMENTS

| | | | |
|---|---|---|---|
| 5,680,601 A | 10/1997 | Rust | |
| 8,386,444 B2 | 2/2013 | Kraus et al. | |
| 10,019,457 B1 | 7/2018 | Stefano et al. | |
| 10,120,890 B2 * | 11/2018 | Bowman | G06F 16/2322 |
| 10,599,395 B1 | 3/2020 | Slager et al. | |
| 11,714,573 B1 * | 8/2023 | Bhardwaj | G06F 3/0614 |
| | | | 711/154 |
| 2004/0034616 A1 | 2/2004 | Witkowski et al. | |

(Continued)

OTHER PUBLICATIONS

Shi, Column Partition and Permutation for Run Length Encoding in Columnar Databases, SIGMOD '20, Jun. 14-19, 2020 Portland, Oregon, 2 pages.

(Continued)

*Primary Examiner* — Etienne P Leroux
(74) *Attorney, Agent, or Firm* — Klarquist Sparkman, LLP

(57) ABSTRACT

Techniques and solutions are described for compressing data and facilitating access to compressed data. Compression can be applied to proper data subsets of a data set, such as to columns of a table. Using various methods, the proper data subsets can be evaluated to be included in a group of proper data subsets to be compressed using a first compression technique, where unselected proper data subsets are not compressed using the first compression technique. Data in the data set can be reordered based on a reordering sequence for the proper data subsets. Reordering data in the data set can improve compression when at least a portion of the proper data subsets are compressed. A data structure is provided that facilitates accessing specified data stored in a compressed format.

40 Claims, 23 Drawing Sheets

(56) References Cited

U.S. PATENT DOCUMENTS

| | | | |
|---|---|---|---|
| 2009/0006399 A1 | 1/2009 | Vijayshankar et al. | |
| 2013/0318128 A1 | 11/2013 | Zhan et al. | |
| 2014/0149367 A1* | 5/2014 | Benkstein | G06F 16/23 707/693 |
| 2015/0106397 A1 | 4/2015 | Mitchell et al. | |
| 2015/0178811 A1 | 6/2015 | Chen | |
| 2016/0006663 A1 | 1/2016 | Zhang | |
| 2016/0378814 A1 | 12/2016 | Bowman et al. | |
| 2017/0031944 A1 | 2/2017 | Faerber et al. | |
| 2018/0137112 A1 | 5/2018 | Barbas et al. | |
| 2019/0179813 A1 | 6/2019 | MacNicol et al. | |
| 2020/0097571 A1 | 3/2020 | Mathur | |
| 2021/0367613 A1 | 11/2021 | Shi et al. | |

OTHER PUBLICATIONS

Buchsbaum et al., "Improving table compression with combinatorial optimization," ACM SODA (2002), pp. 213-222.
Lemke et al., "Speeding up queries in col. stores: a case for compression," DaWak (2010), pp. 117-129.
Jovanovski et al., "A meta-heuristic approach for RLE compression in a column store table," Soft Computing 23, 12 (2019), pp. 4255-4276, 22 pages.
Lemire et al., "Reordering cols. for smaller indexes," Information Sciences, 181, 12 (2011), pp. 2550-2570.
Lemire et al., "Reordering rows for better compression: Beyond the lexicographic order," ACM TODS 37, 3 (2012) 20:1-20:29.
European Search Report received in European Patent Application No. 21172977.7, dated Aug. 17, 2021, 13 pages.
Giura et al., "NetStore: An Efficient Storage Infrastructure for Network Forensics and Monitoring," Recent Advances in Intrusion Detection, Sep. 15, 2010, Springer Berlin Heidelberg, Berlin Heidelberg, pp. 277-296,.
Paradies et al., "How to juggle columns," IDEAS 10 2010, Aug. 16, 2010, pp. 205-2015.
Non-Final Office Action received in U.S. Appl. No. 16/878,419, filed May 2, 2022, 32 pages.
Notice of Allowance received in U.S. Appl. No. 16/878,419, filed Aug. 24, 2022, 7 pages.

* cited by examiner

```
Incremental Selection(table, n_c, n_r, cardinalities):
    bitlength = [b(cardinalities[0]),b(cardinalities [1]),…b(cardinalities[n_c-1])]
    uncompressedColumnSize = [I * n_r for I in bitlength]
    currentSize = sum (uncompressedColumnSize)
    sortedColumns = [0,1,…n_c-1].sort(key = lambda x: cardinalities[x])
    index = -1
    while index < n_c-1:
        index = index +1
        table(orderby(0,1,…index)) #it is easy to order from (0,1,…index-1) to (0,1,..index)
        sizeIfCompress = currentSize - uncompressedColumnSize[index]+runLengthEncode(index)
        if sizeIfCompress > currentSize:
            index = index -1
            break
    return [0,1,…index]
```

FIG. 5

```
Incremental_selection_global_max(table, n_c, n_r, cardinalities):
    bitlength = [b(cardinalities [0]), b(cardinalities [1]), ... b(cardinalities[n_c-1])
    uncompressedColumnSize = [I * n_r for I in bitlength]
    currentSize = sum (uncompressedColumnSize)
    sortedColumns = n_c.sort(key = lambda x: cardinalities[x])
    compressSmallestCol = [0] * (n_c+1)
    compressSmallestCol[0] = currentSize
    index = -1
    while index < n_c:
        index = index +1
        table(orderby(0,1,...index)) #it is easy to order from (0,1,...index-1) to (0,1,...index)
        compressedSize = currentSize - uncompressedColumnSize[index]+runLengthEncode(index)
        compressSmallestCol [index+1] = compressedSize
    optimalCompression = index of smallest item in compressSmallestCol
    return sortedColumns[0,1,...optimalCompression-1]
```

FIG. 6

```
Incremental_selection_abandon_expanding_columns(table, n_c, n_r, cardinalities):
    bitlength = [b(cardinalities [0]), b(cardinalities [1]), ... b(cardinalities[n_c-1])
    uncompressedColumnSize = [I * n_r for I in bitlength]
    sortedColumns = n_c.sort(key = lambda x: cardinalities[x])
    primaryColumns = []
    numberPrimary = 0
    for column in sortedColumns:
        table(orderby(primaryColumns+[column]))
        if runLengthEncode(numberPrimary) < uncompressedColumnSize[column]:
            primaryColumns = primaryColumns + [column]
            numberPrimary ++
    return primaryColumns
```

FIG. 7

```
Correlation_bundles(n_r, n_p, p_set, cardinalities, theta):

M = correlationMatrix(p_set)

for all index (I,J) in M:

if M[I][J] < theta:

M[I][J] = 0 for all index I in [0,…p-1]:

M[I][I] = 0

G = interpretAsGraph(M)

complete = p #placeholder to count highest possible complete graph bundles = []

while G is not empty:

while exist complete subgraph G_s of size p:

bundles.append([node in G_s])

G.remove(G_s)

p = p - 1 for all bundle in bundles:

bundle.sort(key = lambda x: cardinalities[x])

bundles.sort (key = lambda bundle: bundle[0])

flatten = [] #flattening the columns for all bundle in bundles:

for all column in bundle:

flatten.append(column)

return (bundles, flatten)
```

FIG. 9

```
correlation_bundles_log_grouping(n_r, n_p, p_set, cardinalities,threshold):
    Bundles = Correlation_bundles(n_r, n_p, p_set, cardinalities,threshold).bundles
    logGroupBundles = []
    For bundle in bundles:
        logGroupBundles.append(Bundle.split(based on floor(log(x))))
    for all bundle in logGroupBundles:
        bundle.sort(key = lambda x: cardinalities[x])
    logGroupBundles.sort (key = lambda bundle: bundle[0])
    flatten = [] #flattening the columns
    for all bundle in bundles:
        for all column in bundle:
            flatten.append(column)
    return (logGroupBundles, flatten)
```

FIG. 11

```
Reorder_in_log_group(n_r, n_p, p_set, cardinalities):
    p_set.sort(key = lambda x: cardinalities[x])
    logarithmic_groups = p_set.Split_by(b)
    #partition p_set into a list of subsets by the value of the function b
    table.order_by(p_set)
    compressed_size = [0]*n_p
    for all index in [0,...n_p-1]:
        compressed_size[index] = compress_column(p_set[index])
    for all group in logarithmic_groups:
        group.sortby(key = lambda column: compressed_size(column))
    flatten = [] #flattening the columns
    for all group in logarithmic_groups:
        for all column in group:
            flatten.append(column)
    return (logarithmic_groups, flatten)
```

FIG. 12

| Column 1 | Column 2 | Column 3 | Column 4 |
|---|---|---|---|
| 1 | 5 | 1 | 4 |
| 1 | 5 | 5 | 0 |
| 1 | 5 | 3 | 1 |
| 3 | 5 | 2 | 2 |
| 2 | 6 | 6 | 4 |
| 2 | 6 | 0 | 3 |
| 0 | 6 | 4 | 5 |

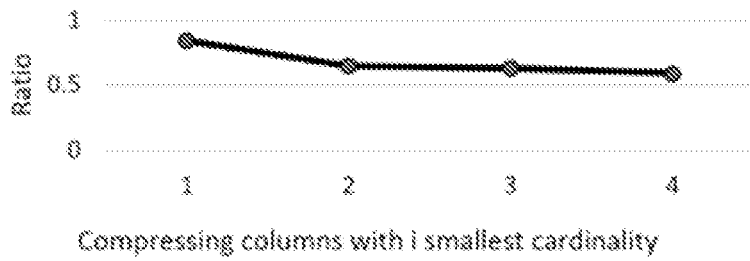
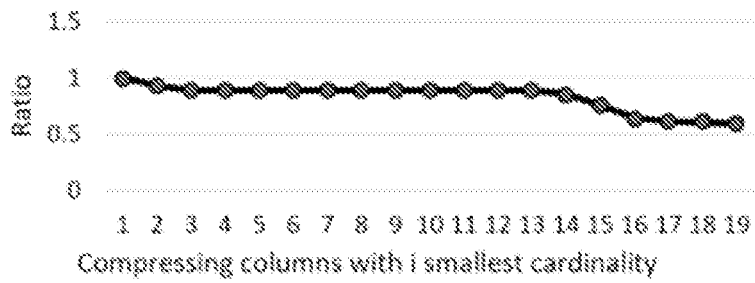
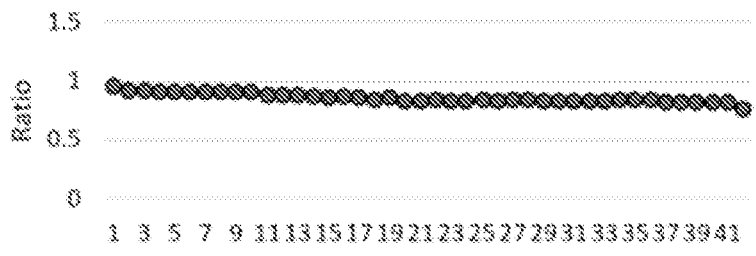
FIG. 17

| Dataset | No compression, or empty primary | Compress all, or empty secondary | First local minimum | Best local minimum | Abandon expanding columns |
|---|---|---|---|---|---|
| Wikileaks | 58,469,132 | 31,073,761 | 23,398,807 | 23,398,807 | 23,398,807 |
| Weather | 140,120,674 | 103,067,253 | 77,566,108 | 77,566,108 | 77,566,108 |
| Census | 46,289,362 | 22,519,309 | 30,342,901 | 21,800,531 | 18,509,296 |

FIG. 19

| Dataset | Ascending | Descending | Correlation grouping ($\Theta = 0.5$) | Correlation grouping up to logarithmic group ($\Theta = 0.5$) | Reordering in log group |
|---|---|---|---|---|---|
| Wikileaks | 6,693,320 | 8,196,558 (122.46% ascending) | 6,693,320 (100.00% ascending) | 6,693,320 (100.00% ascending) | 6,693,320 (100.00% ascending) |
| Weather | 5,475,023 | 7,9987,534 (145.89% ascending) | 5,425,463 (99.10% ascending) | 5,512,679 (100.69% ascending) | 5,475,023 (100.00% ascending) |
| Census | 18,209,091 | 31,347,013 (172.15% ascending) | 18,734,408 (103.88% ascending) | 18,207,265 (99.99% ascending) | 18,348,544 (100.77% ascending) |

FIG. 20

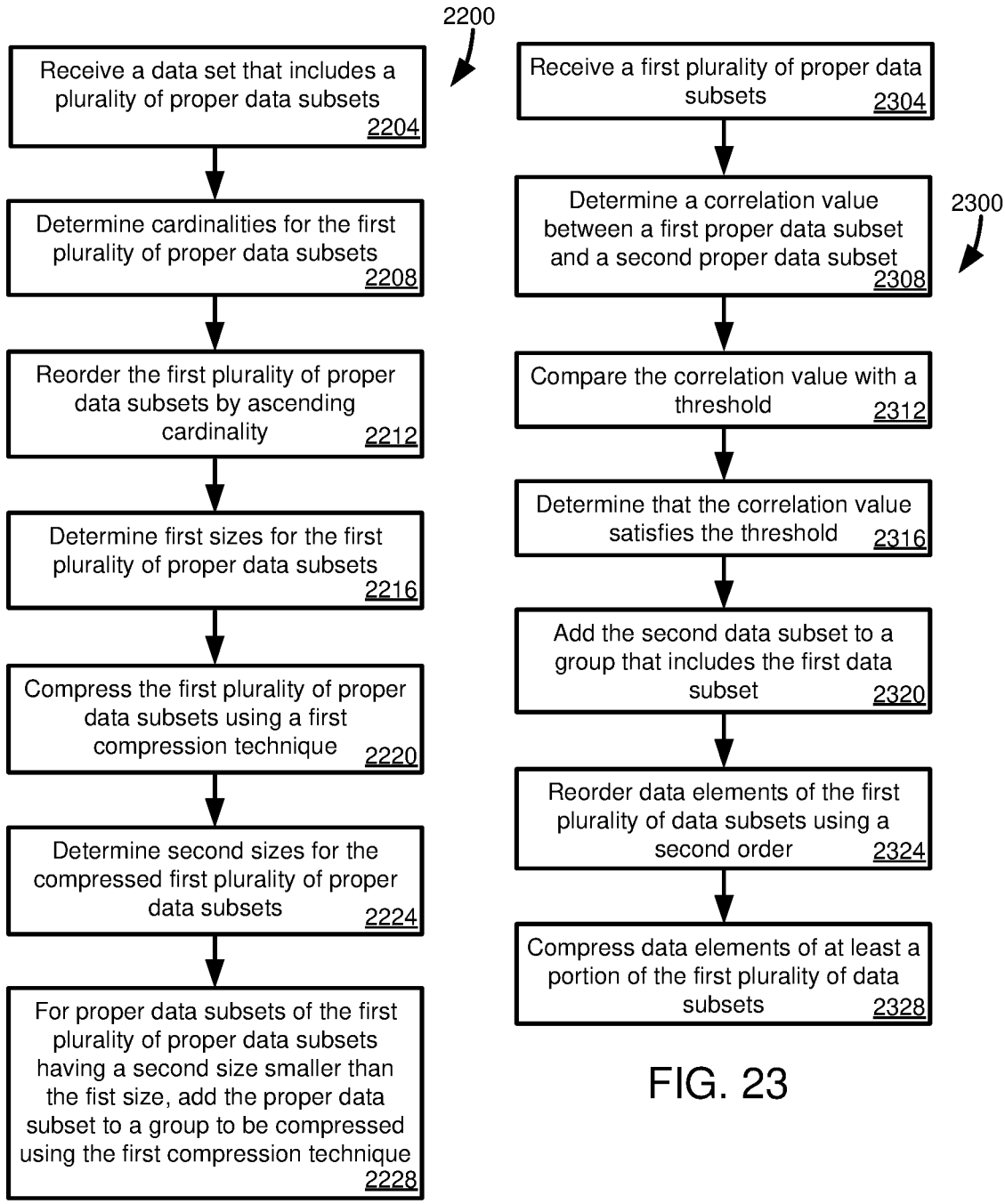

DATA COMPRESSION TECHNIQUES

CROSS REFERENCE TO RELATED APPLICATIONS

This is a continuation of U.S. patent application Ser. No. 16/878,419, filed on May 19, 2020, which is hereby incorporated herein by reference.

FIELD

The present disclosure generally relates to techniques for compressing data. Particular implementations relate to techniques for improving compression efficiency, or for more quickly retrieving selected data from a compressed data source.

BACKGROUND

Software applications, particularly enterprise level software applications, often are desired to access enormous volumes of data. Storing such data can be problematic, particularly if it is desired to store the data in a format that can be quickly processed by a computer, such as storing the data in RAM. Various compression techniques have been developed for storing data, both in primary memory, such as RAM, or in secondary storage, such as disk-based technologies.

As a particular example, it is typically desired that OLAP database applications be able to process extremely large volumes of data quickly. Some database systems, such as SAP HANA, of SAP SE, of Walldorf, Germany, use in-memory column-store techniques. In a column-store database, data is maintained in storage in column format, where each column contains data for that column for multiple rows, as opposed to storing data on a row-by-row basis, where data for multiple columns is stored for each row, in a row-store database. Column-store databases can be useful, including because they can take advantage of compression techniques such as dictionary compression and run-length encoding. However, due to large data volumes, and other issues involving compressed data, such as being able to locate particular data values quickly, improved compression techniques and techniques for managing and accessing compressed data are still of significant interest.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Techniques and solutions are described for compressing data and facilitating access to compressed data. Compression can be applied to proper data subsets of a data set, such as to columns of a table. Using various methods, the proper data subsets can be evaluated to be included in a group of proper data subsets to be compressed using a first compression technique, where unselected proper data subsets are not compressed using the first compression technique. Data in the data set can be reordered based on a reordering sequence for the proper data subsets. Reordering data in the data set can improve compression when at least a portion of the proper data subsets are compressed. A data structure is provided that facilitates accessing specified data stored in a compressed format.

In one aspect, a method is provided for determining proper data subsets of a plurality of proper data subsets to be compressed. A particular implementation can include determining columns of a table that should be compressed using run-length encoding and columns that should be left uncompressed.

A data set is received that includes a first plurality of proper data subsets. In a particular example, the data set is a table, and the first plurality of proper data subsets correspond to columns of the table. Each proper data subset includes a plurality of elements of the data set, where the elements are associated with respective positions in the given proper data subset. For example, a proper data subset can include values for a plurality of rows of the table. The data elements in the columns of the table can be ordered such that a row of the table can be reconstructed by retrieving the values from the columns at the same position of the columns.

Cardinalities for the first plurality of proper data subsets are determined. Cardinality refers to the number of unique values in a proper data subset, such as the number of unique values in a given column. The first plurality of proper data subsets are reordered by ascending cardinality. For respective proper data subsets of a second plurality of proper data subsets of the first plurality of proper data subsets, a first size is determined. For respective proper data subsets of the second plurality of proper data subsets, the proper data subset is compressed using a first compression technique to provide a compressed proper data subset.

For respective compressed proper data subsets of the second plurality of proper data subsets, a second size is determined. For respective proper data subsets of the second plurality of proper data subsets that have a second size smaller than the first size, the respective proper data subset is added to a group of proper data subsets to be compressed using the first compression technique.

In a further aspect, a method is provided for determining an order to be used in compressing proper data subsets of a data set. In a particular example, the method can represent determining an order of table columns, where the order is used to reorder rows of the table prior to compressing at least a portion of the table columns.

A first plurality of proper data subsets are received. The proper data subsets have a first order, and include a plurality of data elements. Data elements are associated with positions in the proper data subsets and data elements at a particular position within a given proper data subset are correlated with data elements of other proper data subsets at the given positions of the other proper data subsets. For example, a proper data subset can include values for a plurality of rows of a table. The data elements in the columns of the table can be ordered such that a row of the table can be reconstructed by retrieving the values from the columns at the same row position of the columns.

A second order of the proper data subsets is determined as follows. A correlation value is determined between a first proper data subset of the first plurality of proper data subsets and a second proper data subset of the first plurality of proper data subsets. The correlation value is compared with a threshold. It is determined that the correlation value satisfies the threshold. Based on determining that the correlation value satisfies the threshold, the second proper data subset is added to a group that includes the first proper data subset.

Data elements of the first plurality of proper data subsets are reordered using the second order. Data elements of at least a portion of the first plurality of proper data subsets are compressed.

In another aspect, a method is provided for retrieving a value for a specified data element of a data set that includes a plurality of data elements. In a particular example, the method can be used to retrieve a value ID for a specified row of a compressed table column compressed using dictionary compression.

A request is received for a first data element value of a data set that includes a plurality of data elements. A first position group, having a plurality of data element positions, is determined that includes the first data element value. A first logical pointer value is determined that is specified for the first position group. The first logical pointer is dereferenced to a first data structure that includes data element positions and data values. A position of the first data element is identified in the first data structure. The first value, specified in the first data structure for the first data element, is determined. The first data element value is returned in response to the request.

The present disclosure also includes computing systems and tangible, non-transitory computer readable storage media configured to carry out, or including instructions for carrying out, an above-described method. As described herein, a variety of other features and advantages can be incorporated into the technologies as desired.

BRIEF DESCRIPTION OF THE DRAWINGS

FIG. 5 is pseudocode for an embodiment of the "first local minimum" method of selecting table columns to be compressed.

FIG. 6 is pseudocode for an embodiment of the "best local minimum" method of selecting table columns to be compressed.

FIG. 7 is pseudocode for a variant of the method of FIG. 6, where expanding columns are abandoned.

FIG. 9 is pseudocode for an embodiment of a "correlation bundles" technique that can be used to order table columns to be compressed.

FIG. 11 is pseudocode for a variant of the technique of FIG. 9, where a correlation bundle may be subdivided based on cardinality differences between columns in the correlation bundle.

FIG. 12 is pseudocode for a variant of the technique of FIG. 11, where columns within a correlation bundle are ordered by ascending compression size.

FIG. 17 is graphs of the ratio of compression results for run-store run-length encoded and location-store run-length encoding as additional columns are included in a set of columns being compressed.

FIG. 19 is a table illustrating results of various selection techniques for selecting columns to be compressed.

FIG. 20 is a table illustrating results of various ordering techniques used in determining a column order to be used in reordering rows of a table prior to table compression.

FIG. 22 is a flowchart of an example method for determining proper data subsets of a data set to be compressed.

FIG. 23 is a flowchart of an example method for determining a compression order for proper data subsets of a data set.

DETAILED DESCRIPTION

Example 1—Overview

Software applications, particularly enterprise level software applications, often are desired to access enormous volumes of data. Storing such data can be problematic, particularly if it is desired to store the data in a format that can be quickly processed by a computer, such as storing the data in RAM. Various compression techniques have been developed for storing data, both in primary memory, such as RAM, or in secondary storage, such as disk-based technologies.

As a particular example, it is typically desired that OLAP database applications be able to process extremely large volumes of data quickly. Some database systems, such as SAP HANA, of SAP SE, of Walldorf, Germany, use in-memory column-store techniques. In a column-store database, data is maintained in storage in column format, where each column contains data for that column for multiple rows, as opposed to storing data on a row-by-row basis, where data for multiple columns is stored for each row, in a row-store database. Column-store databases can be useful, including because they can take advantage of compression techniques such as dictionary compression and run-length encoding.

However, due to large data volumes, and other issues involving compressed data, such as being able to locate particular data values quickly, improved compression techniques and techniques for managing and accessing compressed data are still of significant interest.

In one aspect, the present disclosure provides technologies that can be used to select columns of a table to be compressed. That is, in at least some cases, higher compression levels can be achieved by leaving some columns of a table uncompressed.

In another aspect, the present disclosure provides technologies that can be used to determine a sequence in which columns should be sorted, where rows of the table are sorted according to reorderings resulting from sorting columns in the determined sort order. Determining an order for sorting can, in some cases, improve compression results. For example, sorting can result in a table overall having fewer value runs of longer length, which can provide improved compression results using run-length encoding.

Compressed data can sometimes be stored in different formats. In the case of run-length encoding, information can be stored as a run-store or a location-store. Typically, run-stores provide better compression, but location stores facilitate the retrieval of selected values from the compressed data. The present disclosure provides a data structure that can be used to expedite access to data stored in a run-store format.

Disclosed technologies can be used together, or individually. In addition, disclosed technologies can be used with other techniques. For example, data to be compressed using run-length encoding can optionally first be compressed using dictionary compression.

Example 2—Example Dictionary Compression Technique

Figure 1:
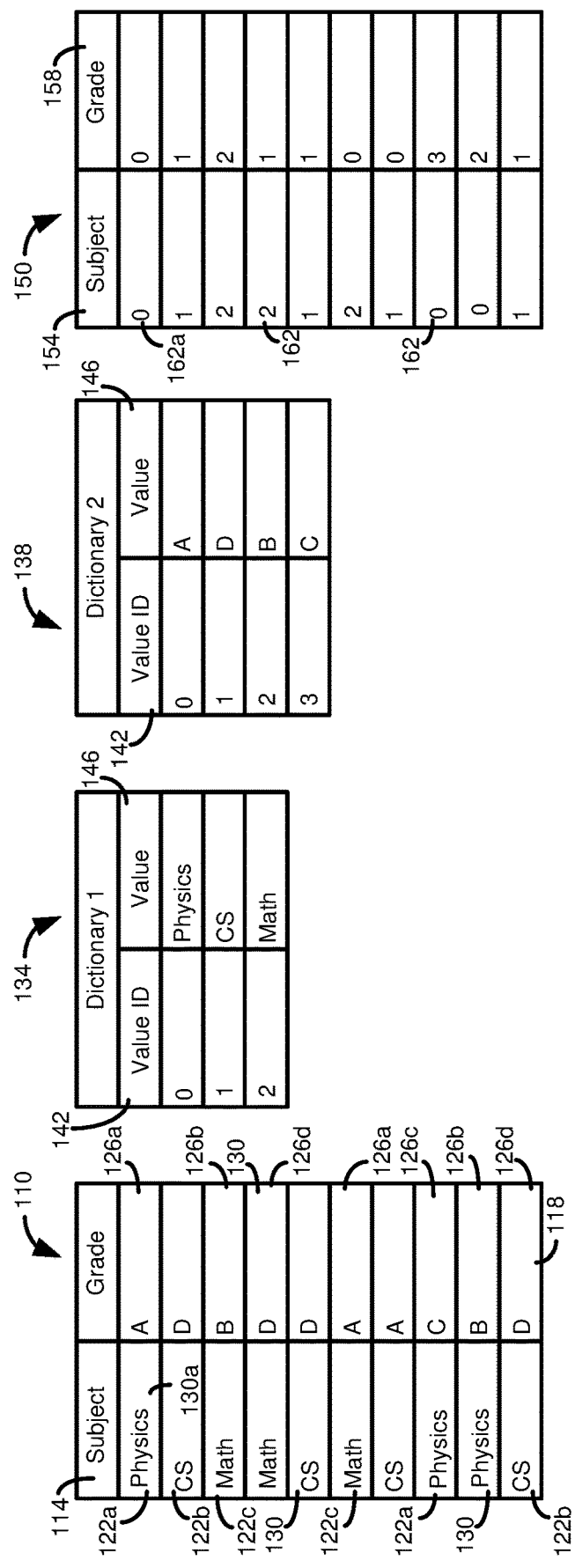
FIG. 1 is a diagram illustrating a dictionary compression technique.

FIG. 1 illustrates how dictionary compression can be used to compress a series of data values, such as data values for a column of data for a table of a relational database system. FIG. 1 illustrates an uncompressed table 110, which has a column (or field or attribute) 114 representing a subject, such as a subject of a course in a university or college environment, and a column 118 representing a grade that may have been obtained in the course.

The columns 114, 118 include a number of discrete values 122, shown as values 122a-122c, and discrete values 126, shown as values 126a-126d, respectively. Note that some of the rows 130 of the table 110 have the same values. That is, a given column 114, 118 may have multiple occurrences of a value 122, 126. The number of unique values in a column can be referred to as the cardinality of the column. So, column 114 has a cardinality of three, since it has three unique values (CS, math, physics), while column 118 has a cardinality of four (having values, A, B, C, D). Generally, a column can have a cardinality that is in the range of one (i.e., all values are the same) and a cardinality equal to the number of rows (or records) in a table (i.e., all values are different, such as if the column serves as a primary key for the table).

Dictionary compression assigns a value ID to each unique value in the column. The column can be compressed by replacing the value with the value ID. It can be seen how replacing a twenty character string with an integer can conserve storage space. Table 134 is an example dictionary for column 114, and table 138 is an example dictionary for column 118. Each dictionary 134, 138 has a column 142 for a value ID and a column 146 providing the original field value associated with that value ID. Note that each value ID and value is unique, such that the cardinality of the value ID column 142 and the cardinality of the field value column 146 are each equal to the number of rows in the respective dictionary 134, 138.

Table 150 represents the table 110 after applying dictionary compression. Columns 154 and 158 correspond to the columns 114, 118, but the original field values have been replaced by the value IDs indicated by the respective dictionary 130, 134. For example, row 130a of table 110 corresponds to row 162a of table 150. Rather than "physics," the value for row 162a of column 154 has the value of "0," which is the value ID specified for "physics" in the dictionary 134 for the column 114. The value for row 162 of the column 158 has the value of "0," which is the value ID specified for "A" specified in the dictionary 138 for the column 118.

Note that table 150 has its rows 162 in the same order as the rows 130 of table 110. As will be described, in some cases better compression can be achieved by reordering a column of a table. In such cases, other columns in the table are reordered in a similar manner, such that all the values are in the same position in each column, even though the columns may be stored separately (e.g., in a vector or an array), and even though some columns may be compressed and other columns may not be compressed. Maintaining information for a particular row of an original table in a reordered table can be important, as it can allow an entire row of the original table to be reconstructed by selecting values at the same, corresponding position of each reordered column. However, in other cases, row order need not be preserved across columns, such as when aggregate values are to be calculated on a column by column basis, and is less of interest to retrieve values for multiple columns in the same row.

Example 3—Example Row Reordering Based on Column Sorting Order

Figure 2:
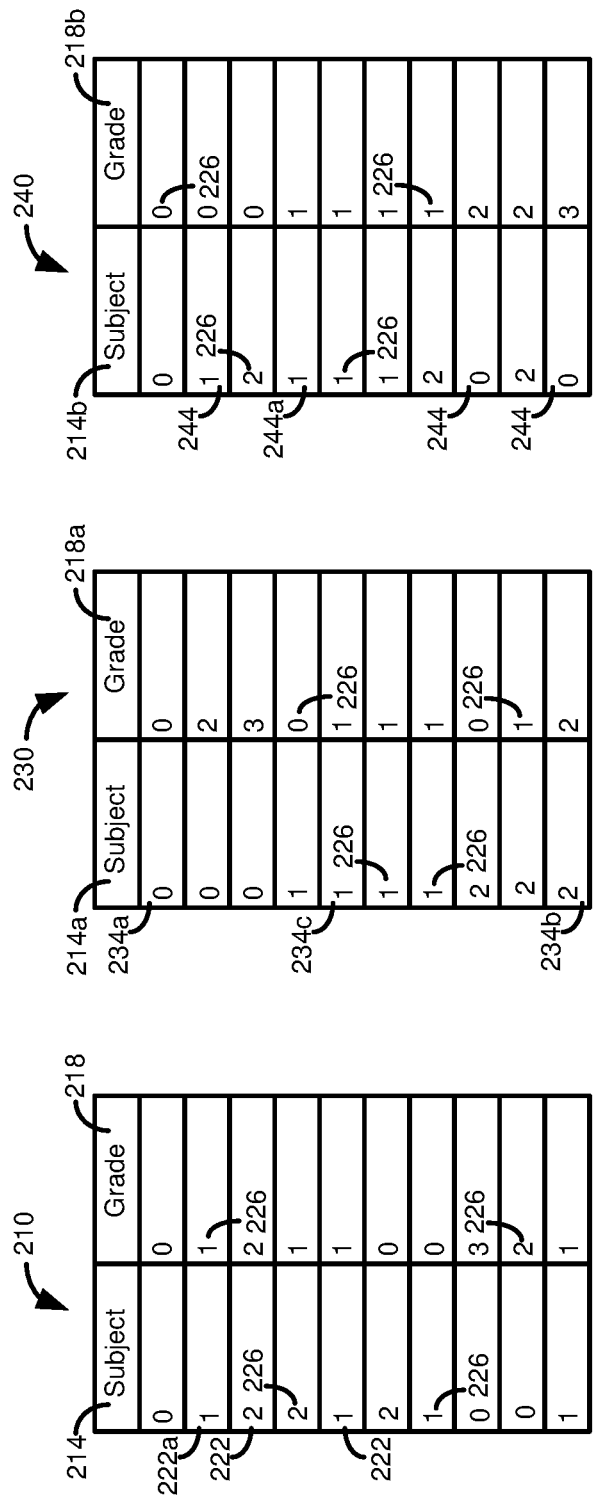
FIG. 2 is a diagram illustrating how a table can be reordered based on a reordering of rows for one or more columns of the table.

As explained in Example 2, columns can be ordered. When a column is part of a table having multiple columns, typically one column is chosen to be ordered first, and the results of that reordering are then applied to the other columns in the table. FIG. 2 illustrates how a table 210, which corresponds to the dictionary-encoded table 150 of FIG. 1, can be ordered.

Table 210 has columns 214, 218 and rows 222. Each row 222 can represent a particular entity (i.e., an instance of an entity type represented by the table 210), such that the values 226 in the columns 214, 218 for a row have some relationship (e.g., a particular grade for a particular course, as in the table 110 of FIG. 1). In at least some cases, it may be desired to retrieve values 226 for multiple columns 214, 218 of a given row.

In this simple example, since table 210 has two columns 214, 218, there are two possible options for reordering the columns—(1) ordering values in column 214 and then applying the resulting order to column 218; or (2) ordering values in column 218 and then applying the resulting order to column 214.

Table 230 illustrates column 214a, which has values 226 corresponding to those in column 214, but now the values have been reordered so that the value IDs ascend in value going from the first record 234a in the table to the last record 234b in the table. Column 218a has been reordered as compared with column 218 of table 200. The reordering for column 218a is accomplished by applying the order for column 214a to the values in column 218, such that values in a given row 222 are preserved in a row 234 of the table 230, even though the row may occur at a different position of the table 230 than in the table 210. It can be seen, for example, that row 222a of table 210, the second row, is the fifth row 234c of the table 230. It can also be seen that while the values 226 for the column 214a are in an order, the values for the column 218a are unordered (at least unordered by value, instead the ordering is by row 222, based on the ordering used for the column 214a).

Table 240 illustrates columns 214b and 218b, which correspond to the columns 214, 218, but with the rows 244 (and the corresponding values 226 of the columns 214b, 218b) ordered by values for the column 218 (as compared with table 230, which was reordered by values for column 214). It can be seen that the values 226 for column 218b are in ascending order, and that the values for column 214b have been reordered to preserve the rows 222 of the table 210. Continuing the example above, row 222a, the second row of the table 210, appears at row 244a, the fourth row, of the table 240.

As will be discussed in subsequent examples, as well as was described in Example 1, reordering a column of a table can be beneficial, including because it can improve column compression using techniques such as run-length encoding. The present disclosure describes strategies for determining an order for columns of a table that should be used as the basis for reordering row of the table. These strategies can be used with uncompressed tables, or can be used with tables that have already been (or will be) compressed in another manner, such as using dictionary compression.

Example 4—Example Techniques for Storing Run-Length Compression Information

Figures 3, 4:
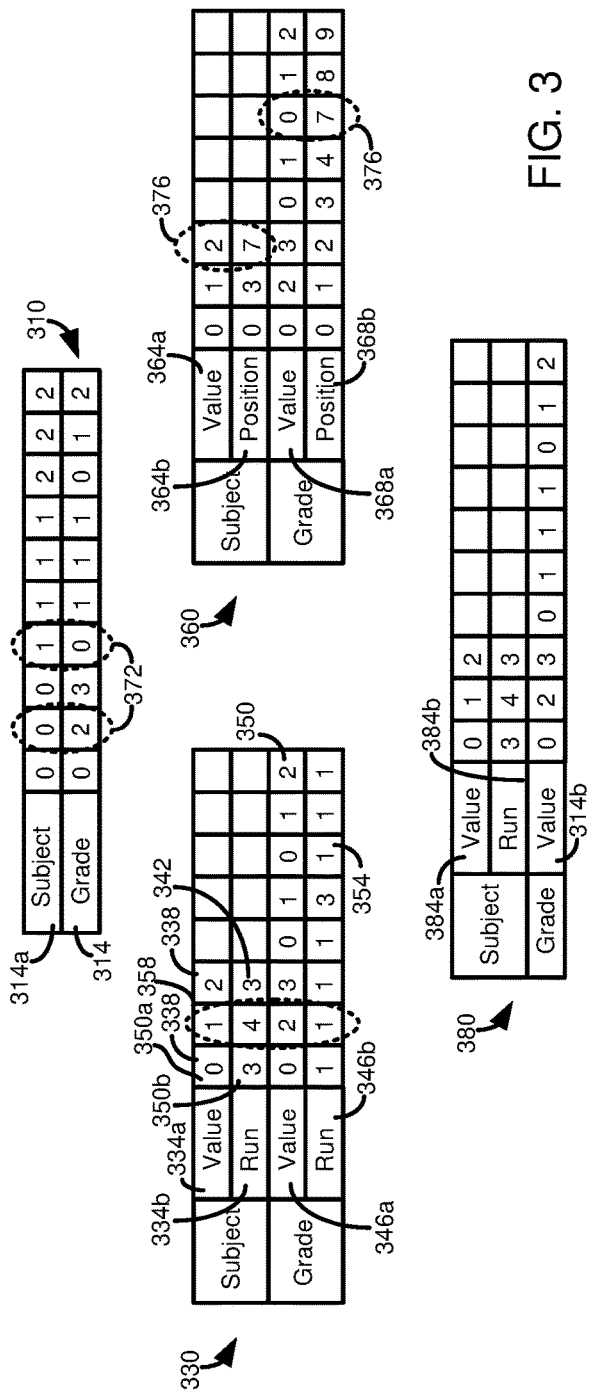
FIG. 3 is a diagram illustrating different techniques for storing run-length compression information, and how improved compression can be achieved by only compressing certain columns of a table.
FIG. 4 is a table illustrating notations that are used in describing certain disclosed technologies.

FIG. 3 illustrates how data, such as values in a column of a table in a relational database system, can be compressed using run-length encoding. FIG. 3 illustrates a table 310, which corresponds to the table 230 of FIG. 2, but rotated such that the columns 214a, 218a of the table 230 have been rotated such that they form rows 314 of the table 310. The rotation is for convenience of presentation, but also illustrates how compression techniques can be applied to data sets, even if the data sets are not maintained as a column or do not correspond to columns of a table.

Run-length encoding takes into account repeated values in a sequence of data, where a data structure can track values and the number of times the value is repeated before a different value is encountered. Table 330 illustrates the results of applying run-length encoding to the table 310. Row 334a of the table 330 provides value IDs 338 for the "subject" (rotated) column 314a. For each value ID 338, a row 334b stores the run-length 342 for a particular value ID 338. In a similar manner, rows 346a, 346b store value IDs 350 and run-lengths 354 for the "grade" column 314b of the table 310. Each column 358 of the table 330 thus provides a combination of a value ID 338 and a run-length 342 for that occurrence of the value ID.

As an example of how the table 330 can be constructed, consider row 314a of the table 310. Row 314a begins with the value ID of "0," and that value is repeated for the next two positions—there are three consecutive occurrences of the value ID "0." This information is recorded in the table 330 by providing the value ID of "0" in cell 350a and the run-length of "3" in cell 350b. Thus, one column (and two values) in table 330 can store three column's worth of data (six values) of the table 310—thus further compressing the data in the table 310 that was already compressed using dictionary compression.

Table 330 represents one way of storing run-length encoding information, which can be referred to as run-store run-length encoding, since the table 330 stores run lengths. Table 360 represents an alternative way of representing this information, which can be referred to as location-store run-length encoding. The table 360 includes rows 364a, 364b that store value IDs and rows 368a, 368b that store positions in the original sequence of values where a corresponding value ID (e.g., in a given column 372 of the table 310) occurs. However, the table 360 only includes entries (i.e., a new column 376) for a pair of rows 364, 368 (corresponding to columns, oriented as rows, 314a, 314b) when a value ID change occurs in the sequence of values.

As an example, the table 310, in row 314a, starts with a value ID of "0" at position 0, so that information is entered into the first position of rows 364a, 364b of the table 360. The value of "0" repeats until position three of the row 314a, where the value of "1" occurs. So, the value ID of "1" and the position of "3" are entered into the second position of the rows 364, 36b. It is assumed that all positions between a pair of given, adjacent columns of a set of rows 364, 368 of table have the value ID of the leftmost column in the pair. Continuing the example, since "1" does not occur until position "3," the table 360 indicates that the value ID of "0" is present for all positions starting at the first position in rows 364 (position zero) and ending at the last position prior to the position of the value of "1" in the row 314a (position three)—in this case the values for the rows 364 indicate that positions 0-2 have the value ID of "0."

It can be useful to measure the efficiency of a compression scheme. One measure that can be used to determine compression efficiency is to determine the number of bits required to represent a table (or table component, such as a particular column) The values 350a of row 314a and the values 350b of row 314b of table 310 each require two bits to store (because the values are between 0-3, and so can be represented as 00, 01, 10, 11). Since each row 314a, 314b has ten positions, the number of bits to store a single column is 10*2=20 bits, and therefore the cost to store the entire table is 20 bits/column*2 columns=40 bits.

In some cases, compressing a column or table can be more efficient, but in other cases compressing one or more columns, including all columns, in a table can use more space than the compressed counterpart, since values must be stored for the value itself and the run-length. As runs become longer, and fewer runs are present (e.g., more consecutive repeated values), run-length encoding typically provides more efficient storage than an uncompressed representation of the data.

In table 330, both row 334a and row 334b have been compressed using run-length encoding. Row 334a includes values between 0 and 2, and so two bits are needed for this information. Row 334a includes three positions, so 2*3=6 bits are needed to store the data in row 334a. Row 334b has values of 3 or 4, and so three bits are needed to encode this information. Since row 334b also has three positions, 3*3=9 bits are needed to store the data in row 334b. Overall, the data corresponding to row 314a thus requires 15 bits to store. Turning to row 314b, the corresponding data in table 330 is in rows 346a, 346b. Row 346a has eight positions and two bits are required to represent the possible values (between 0-3), for a total of 8*2=16 bits. Similarly, row 3346b has eight positions and requires two bits to store the possible values (between 0 and 3), for a total of 8+2=16 bits. Thus, 32 bits are required to store the data corresponding to the row 314b. Table 330 thus requires 15+32=47 bits for storage, which is more than the 40 bits needed to store the uncompressed table 310.

As will be further described, the present disclosure provides techniques that allow for compression of less than all data in a table, such as by compressing less than all columns in a table. Compression can be used for columns where space will be saved using compression, and compression can be omitted for columns where compression would take up more space.

Table 380 illustrates rows 384a, 384b that correspond to the row 314a of table 310, but have been compressed as described for row 334a of table 330. From the earlier example, it is known that rows 384 require 15 bits to store. Row 314b is left compressed. To store the data in row 314b, two bits are needed to store the value IDs (having values between 0-3) and the row 314b has ten positions. Row 314b thus requires 10*2=20 bits to store. Overall then, the table 380 requires 15+20=35 bits to store, which is 5 bits more efficient than storing the uncompressed table 310, and is 12 bits more efficient than compressing all of the data, as in table 330.

Example 5—Example Techniques for Selecting Table Columns to be Compressed

As explained in Example 4, in a data collection having multiple data subsets, such as a table having multiple columns, compressing all subsets of the data collection can actually require more storage space than the original uncompressed data (where uncompressed data refers to data prior to a particular compression technique, such as run-length encoding, even though the data may have already been compressed using another technique, such as dictionary compression). The present disclosure provides techniques for determining which data subsets in a collection should be compressed and which, if any, subsets should be left uncompressed.

Although evaluation of a single compression technique is described, the disclosed technologies can be used to evaluate compression using different compression techniques. For example, if a column of data is not efficiently compressed using run-length encoding, it can be left uncompressed, or it can be evaluated for another type of compression (such as dictionary compression, in the event the column was not already compressed using dictionary compression). Priorities or orders can be set for different compression techniques, such as one technique being favored as long as it provides some storage efficiency, and other techniques being evaluated if the favored technique does not reduce storage requirements. Or, multiple types of compression can be evaluated for a given data set, and the compression technique that provides the highest level of compression can be used. For an overall data set then, some techniques can use no compression or a single compression technique for all subsets of the data set, and other techniques can use no compression or one of multiple, different compression techniques for data subsets (e.g., one column can be uncompressed, another column can be compressed using run-length encoding, and another column can be compressed using a technique other than run-length encoding).

For ease of presentation, this Example 5, and other portions of the disclosure refer to evaluating multiple columns a table for compression. However, the techniques can be applied to other data collections/data subsets, provided that the discussion is not otherwise clearly only applicable to column data. In some cases, the techniques can be applied to proper data subsets of a data set, where a proper data subset contains less than all elements in the data set. In more particular cases, each proper data subset is a unique proper data subset of the data set (e.g., the intersection of any two proper data subsets is the empty set). In even more particular examples, the number of elements is equal in all proper data subsets of the data sets. Data elements in the proper data subsets can be ordered, such that there is a relationship between data elements in proper data subsets at a particular position in any given proper data subset.

This Example 5 takes as an example a table T, stored in column format (i.e., data for the table is maintained as consecutive column values, rather than storing consecutive values for multiple columns of individual rows of the table). Table T has a total number of columns $n_c$ and a total number of rows $n_r$. A number of columns to be compressed, such as using run-length encoding, is designated as p. Columns selected for compression can be referred to as primary columns, and are included in a set of primary columns $P_{set}$. The number of unselected, or "secondary," columns is thus $p$-$n_c$. Unless otherwise specified, this Example 5, as well as other Examples of the present disclosure, can use the notation shown in table 400 of FIG. 4.

In order to determine columns to include in $P_{set}$, typically the columns in the table T can be reordered by cardinality, having lowest cardinality columns (which are expected to benefit the most from compression techniques such as run-length encoding) to the left and higher cardinality column to the right. At least at this point, the original row correspondence of the columns is preserved, and so no information is lost by reordering the columns.

Columns can be incrementally analyzed to determine whether they should be added to the set of primary columns $P_{set}$. The set of the $n_c$ columns in the table means that there are $2^{n_c}$ subsets of columns (i.e., the power set of the $n_c$ columns has a size of $2^{n_c}$). At least some disclosed techniques use an incremental selection technique that considers at most $n_c$ subsets of the $2^{n_c}$ possible subsets.

FIG. 5 provides pseudocode 500 for an incremental selection technique that stops at a first local minimum obtained in compressing the columns in a table. After ordering the columns by cardinality, columns are compressed. Each column that has a reduced size after compression (or in some cases has an equivalent size or a reduced size) is added to the primary set of columns $P_{set}$. Once a column is encountered that does not benefit from compression (e.g., requires the same amount of space, or more space, to store than the uncompressed column), the algorithm can stop. That is, it may be expected that columns with a higher cardinality than a column being evaluated that does not benefit from compression would also not benefit from compression. In practice, whether a second column benefits from compression may not be directly tied to whether the cardinality of the second column is higher (or the same as) a first column. For example, even if the second column has a higher cardinality than the first column, the second column may have fewer/longer runs than the first column, and thus may benefit from compression even though the first column did not. The present disclosure provides techniques for dealing with the scenario.

According to the "first local minimum" incremental selection technique of the pseudocode 500, primary columns in $P_{set}$ are compressed, while secondary columns are left uncompressed. The benefit of this scenario is demonstrated by the discussion in Example 4, where the table 380 having an uncompressed column 314b requires less storage than the table 330 having both columns 314a, 314b compressed.

FIG. 6 provides pseudocode 600 for another incremental selection technique, which can be referred to as the "best local minimum" selection technique. The technique described in the pseudocode 600 is similar to the pseudocode 500, in that columns are first ordered by ascending cardinality. All columns are then compressed. At each column position, a compression size for the table is determined based on compressing that column position and all previous column positions. The size of the compressed columns is added to the size of the uncompressed column. In other words, for a table having columns [0] . . . [$n_c$], the compressed size of the table at column i is the compressed value of columns [0] . . . i and the uncompressed values of columns i+1 . . . $n_c$. The technique thus produces compression sizes for each column in $n_c$. The last column in $n_c$ that produces the lowest overall compression size for the entire table is selected as the last column in $P_{set}$.

As an example, assume that a table has five columns, and that the compression values for the table, overall, are 25, 20, 28, 18, 30. Since 18 is the lowest compression size for the table, columns 0-3 would be included in $P_{set}$, and compressed, while column 4 would remain uncompressed. If instead the first local minimum technique were used, columns 0, 1 would be the only columns included in $P_{set}$, and the overall compression would be less optimized than the result using the best local minimum technique.

The "best local minimum" technique can be more time consuming to execute than the "first local minimum" technique, since all columns are compressed in the "best local minimum" technique, and the compression size of a table with multiple column permutations is calculated, instead of stopping once any column is identified that does not benefit from compression. However, the "best local minimum" technique can result in higher overall compression, as it may identify columns for $P_{set}$ that were not evaluated using the "first local minimum" technique.

FIG. 7 provides pseudocode 700 for another incremental selection technique, which can be referred to as the "best local minimum with abandon expanding columns" selection technique. The technique described in the pseudocode 700 is similar to the pseudocode 500, 600 in that columns are first ordered by ascending cardinality. All columns are then compressed. If a column benefits from compression, it is added to the set of primary columns $P_{set}$. The "best local minimum with abandon expanding columns" technique can also be more time consuming to execute than the "first local minimum" technique, since all columns are compressed in the "best local minimum with abandon expanding columns" technique instead of stopping once any column is identified that does not benefit from compression. However, the "best local minimum with abandon expanding columns" technique can result in higher overall compression, even as compared with the "best local minimum" technical, as it may identify columns for $P_{set}$ that were not evaluated using the "first local minimum" technique, but excludes columns that do not befit from compression, unlike the "best local minimum" technique that does not abandon expanding columns.

In any of the above techniques, the rows of the table can be reordered by sorting the values (or value IDs) for a particular column, such as the column having the lowest cardinality or using the column that is the most compressible after having its values sorted. Typically, once any specified column has been sorted, the resulting reordering is applied to all other columns in the table, whether or not the columns will be compressed, in order to preserve the value correspondence of the table across the columns.

Example 6—Example Techniques for Determining Column Sorting Order to be Used in Reordering Table Rows Another technique to improve table compression is to consider the order used for columns, including the order that will be used in carrying out other techniques, such as the selection of columns to be compressed as discussed in Example 5. The ordering of the columns can affect columns selected for compression, compression efficiency for a single column, or compression efficiency for multiple columns. For instance, a particular column may be selected to have its values reordered, and the reordering of rows will then be propagated to other columns in the table, whether or not those columns will be compressed. Selecting a first column for the ordering may provide better or worse compression for other columns than selecting a selecting a second column for the ordering. Similarly, selection of the second and subsequent columns to be used for ordering can affect overall compression efficiency. Thus, it can be beneficial to select a column for ordering that provides lower overall storage costs.

Figure 8:
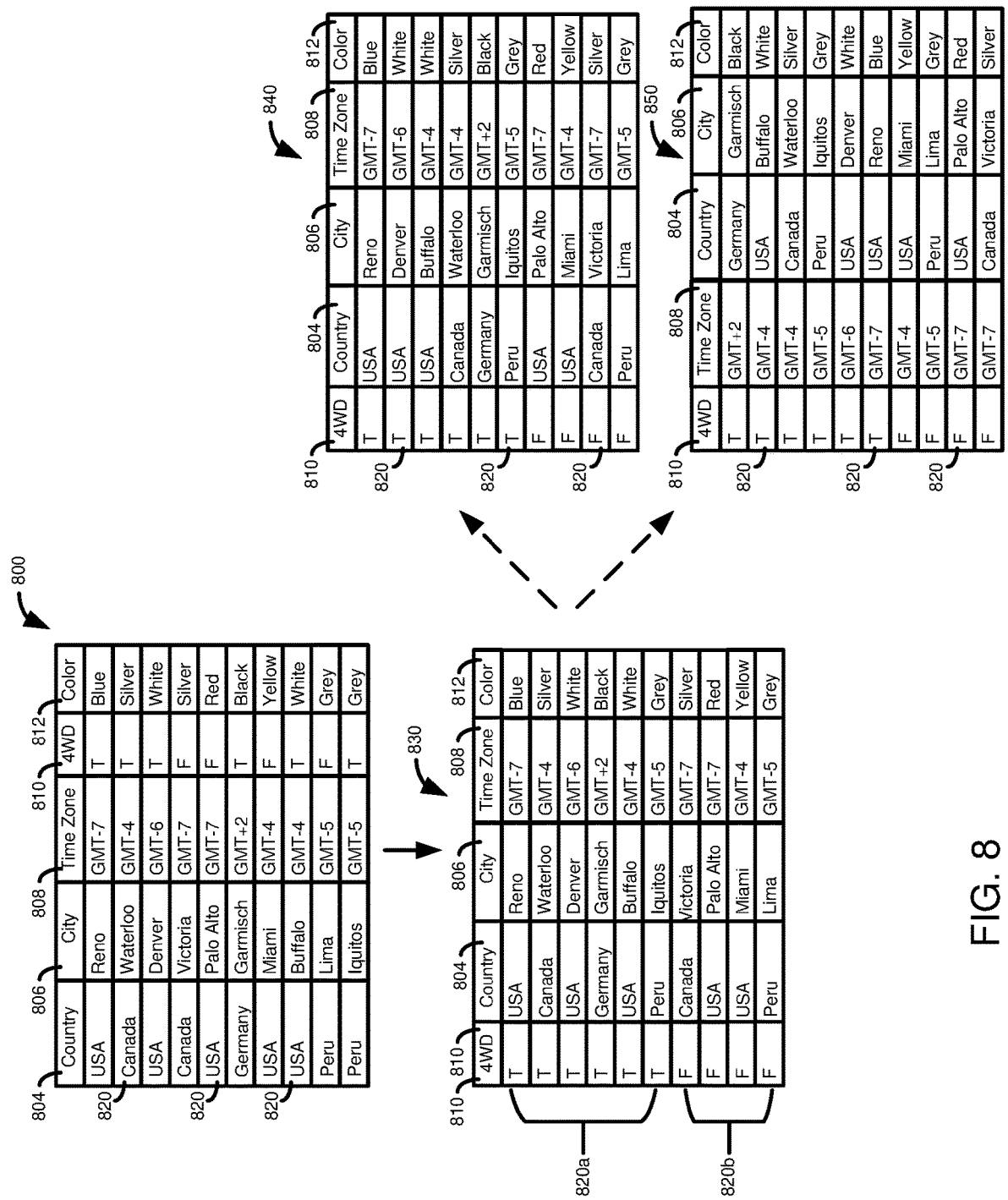
FIG. 8 is diagram illustrating how changing a column sequence used to reorder a table can provide different levels of compression.

One technique for column ordering that has already been described is to order columns by increasing cardinality. In this case, the column with the lowest cardinality is typically selected as providing primary reordering criteria, the column with the next lowest cardinality is selected as the secondary reordering criteria, etc. FIG. 8 provides an example of some data for a table 800 having data for a country column 804, a city column 806, a time zone column 808, a column 810 indicating whether a vehicle associated with a given row is a four wheel drive vehicle, and a column 812 indicating vehicle color.

The table 800 includes a plurality of rows 820. So long as the data for each row 820 is kept together, the rows can be reordered without changing the meaning of the table 800/ changing the actual data stored in the table. The table 800 can be ordered by values for one or more of the columns 804-812. In order to preserve the ordering for a given column, the ordering can be carried out sequentially, such as by ordering first by country, then by city, then time zone, etc.

FIG. 8 illustrates a first reordered table 830 corresponding to table 800, but ordered according to values for the 4WD column 810. Thus, rows 820a having a "4WD" value of "T" for column 810 are adjacent, and rows 820b having a value of "F" for column 810 are adjacent.

Note that the sequence of columns 810 used for ordering can provide different results. For example, a second reordered table 840 corresponds to the table 830, but is additionally ordered by values for the country column 804. A third reordered table 850 table corresponds to the table 830, but is additionally ordered by values for the time zone column 808. While the rows 820 for all of the tables 800, 830, 840, 850 contain the same data, they are in different orders. Tables 840, 850 preserve the ordering for the 4WD column 810, which has two runs of length four each. However, ordering the table 830 by country produces a country column 804a that has a run of length three, a run of length two, and five runs of length one. Ordering the table 830 by time zone produces a time zone column 808 that includes two runs of length two and eight runs of length one. Thus, at least for the possibilities considered in this discussion, the table 840 may be identified as being more compressible than the table 850, and so the compression order of 810, 804 may be preferable to the compression order of 810, 808.

The present disclosure provides techniques that can be used to order rows to improve compression of the columns in a table, such as the columns 804-812 in the table 800. In general, these techniques seek to identify one or more ordering sequences that improve run-lengths in the columns for the table, overall. Note that once the ordering sequence is determined, entire rows 820 in the table 800 are reordered according to that sequence, so that the data in the rows 820 is maintained in the reordered tables 840, 850—only the order of rows has changed, not the actual contents of any of the rows. In at least some cases, after the table 800 is reordered, each column 804-812 (or a subset of such columns) can be compressed individually, and compression information (e.g., run-length encoding information) can be maintained on a column-by-column basis, including storing the compression information in a file that also includes the compressed column data. Further, the reordering techniques of this Example 6 can be combined with other aspects of the present disclosure. In particular, tables in a column can first be partitioned into a primary set and a secondary set. The columns in the primary set can be used to determine the row order for the table. However, the resulting row order can be applied to both the columns in the primary set and the columns in the secondary set.

Techniques that can be used to determine columns that will be used to determine a row order is to carry out the ordering by ascending column cardinality. Taking the table 800 as an example, columns 804-812 have cardinalities, respectively, of four, ten, five, two, and seven. So, ordering the columns using the ascending cardinality technique would result in ordering first by column 810, then by column 804, followed by column 808, then column 812, and finally by column 806.

Another technique that can be used to order columns can be referred to as the "correlation bundles" technique. The correlation bundles technique involves grouping or ordering columns based on correlations between data in the columns. For example, taking the example of table 800, it may be expected that a row's value for the country column 804 may be correlated with the row's values for city column 806 and the time zone column 808. Similarly, the city column 806 may be correlated with the time zone column 808. Even though these columns 804, 806, 808 may have some correlation, a value for one column does not necessarily determine a value for another column. For example, multiple cities may have the same name (e.g., Paris, Tex. versus Paris, France), and so while "Paris" may suggest France (perhaps more strongly) or USA (for Texas), the value for the city column 806 does not directly indicate the value for the country column 804 or the value for the time zone column 808.

Some correlations may be less intuitive. In the example of table 800, involving vehicles, and more particularly the color of a vehicle or whether the vehicle is four wheel drive, initially it may seem that the color of a vehicle, or whether it is four wheel drive, would be unrelated to what country or city a vehicle is associated with. However, it may be that cities that are associated with significant snow fall (e.g., Waterloo, Denver, Reno, Buffalo, Garmisch) or other conditions where a four wheel drive vehicle may be useful (e.g., Iquitos) are more commonly associated with four wheel drive vehicles that cities like Miami, Palo Alto, or Lima. Similarly, it may be that particular vehicle colors are more common in some countries than others, which thus may provide at least a weak correlation with color and country.

The correlation bundle technique uses an insight that applying an ordering to data based on correlations between columns may produce fewer/longer runs than other types of sequence determination techniques, at least with certain types of data sets. Generally, the correlation bundles technique includes calculating correlations between data subsets (e.g., columns of a table), identifying data subsets that satisfy a minimum threshold correlation, grouping those data subsets into bundles, ordering data subsets within a bundle, and ordering the bundles. The result is a permutation or sequence of data subsets in the original data set, such as a sequence of columns. The data set, such as rows of a table, can then be reordered according to the determined sequence, in a similar manner as described in the discussion of the "ascending cardinality" technique.

Any suitable method for determining correlations between data can be used, such as calculating the Pearson correlation coefficient. FIG. 9 provides pseudocode 900 for an example implementation of the correlation bundles technique.

Figure 10:
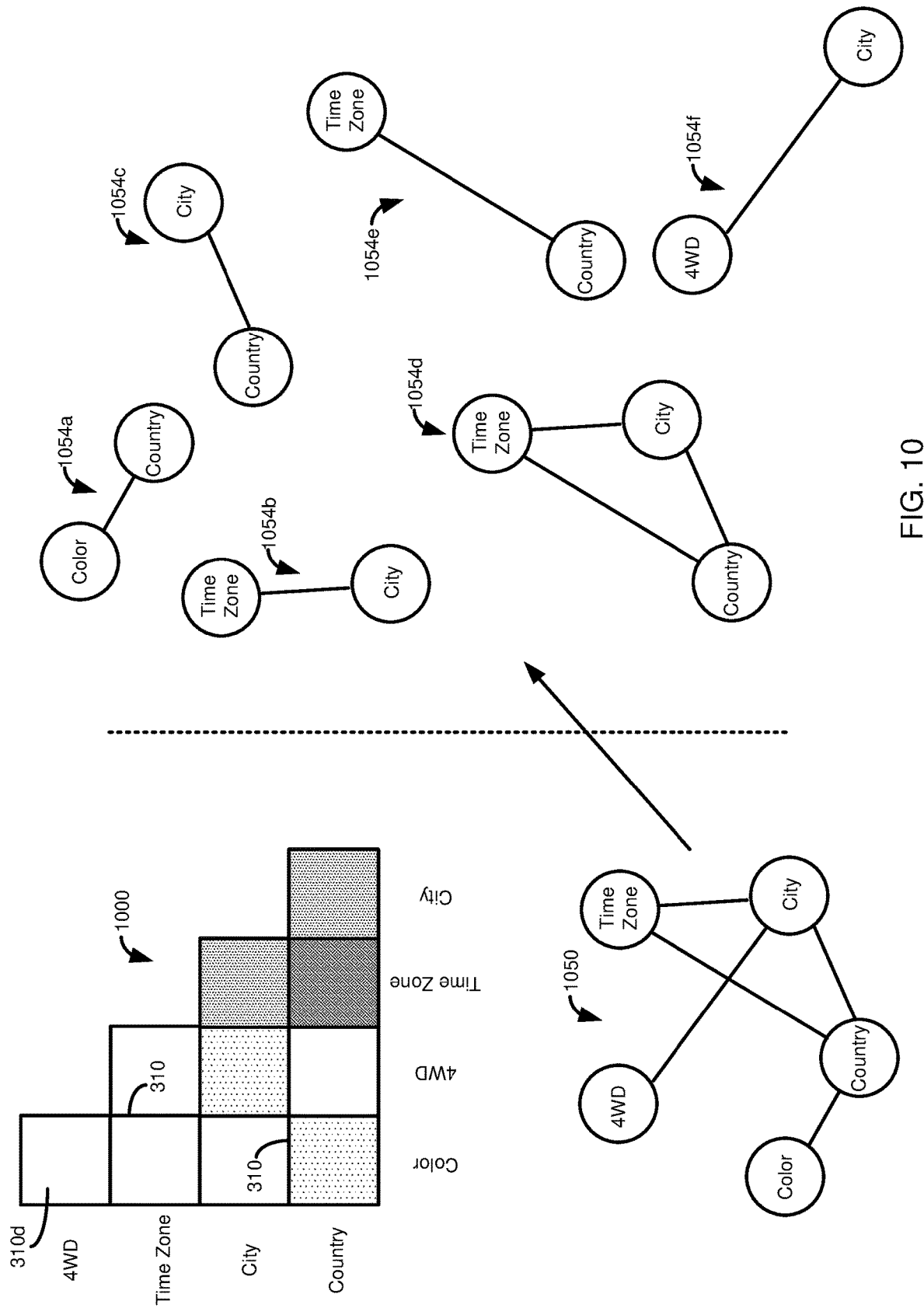
FIG. 10 is diagram illustrating how correlations between columns in a table can be determined and used to form correlation bundles, such as in the technique of FIG. 9.

A matrix of correlation coefficients is calculated. The matrix of the correlation coefficients can be a symmetric matrix, with all its entries between values 1 and −1. With this matrix, correlated column groupings are identified by interpreting the matrix as a graph of p vertices, where p is the number of columns in the partition of primary columns (or all columns in the table if the table has not been partitioned into primary and secondary columns). FIG. 10 illustrates an example matrix 1000 of correlations between attributes of the table 800 of FIG. 8. Rather than numerical values, the matrix 1000 uses shading to represent correlation strength between pairs of attributes, where unshaded squares indicate no or weak correlation and increasing shading density indicates stronger correlations. In this example, it can be seen that color is weakly correlated to country, and no other attribute. Whether a vehicle is four wheel drive is weakly correlated with city, but is not otherwise correlated to any other attribute. Time zone is strong correlated with country, and moderately correlated with city. City is moderately correlated with country.

An induced graph, such as the graph 1050, is partitioned into complete subgraphs, such as subgraphs 1054a-1054f. Edges in the graph 1050 and subgraphs 1054 can be associated with an edge, where the weight of the edge between two vertices (or nodes, which can correspond to columns of a table) corresponds with the correlation between the values in the data represented by the vertices. A threshold θ can be used, and edges in the graph are deleted where the correlation is under θ. The subgraphs 1054-1054f are formed from the remaining edges and used to construct the column bundles.

Complete graphs with a higher number of vertices can be prioritized. For example, FIG. 10 shows the column 804 for country in subgraphs 1054a, 1054c, 1054d, and 1054e. Because subgraph 1054d has a larger number of vertices, subgraph 1054d can be selected for definition of a bundle, which causes the vertices of the subgraph 1054d to be removed from other subgraphs. This process then results in subgraph 1054d being a bundle, while the rest of the columns of the table are associated with single-column bundles (e.g., there is a bundle that only contains color and a bundle that only contains information about whether a vehicle is four wheel drive).

This process is performed until there are only singleton connected graphs, and, as described above for the columns representing "color" and "four wheel drive," they are placed within their own correlation bundles. At the end of this process, a set of column bundles is obtained. The columns can be ordered by ascending cardinalities within each bundle. Furthermore, each bundle in the set of bundles can be ordered by column cardinality, such as by the cardinality of the column having the lowest cardinality in a given bundle.

Continuing with the example of FIG. 10, within the bundle 1054*d*, the columns can be ordered as country, time zone, and then city. Considering all three bundles (1054*d* and the singleton bundles for "color" and "four wheel drive"), "four wheel drive" has a lower cardinality (two) than the lowest cardinality of bundle 1054*d* (four, for country), and a lower cardinality than the cardinality of "color" (having a cardinality of seven). Thus, the final order of the columns is "four wheel drive," "country," "time zone," "city," and "color."

The correlation bundles technique can result in bundles that are comparatively large, or which can have a diverse set of cardinalities (i.e., having some columns with relatively high cardinality and some columns with relatively low cardinality). As described in the "correlation bundles" example and FIG. 10, this effect can be seen in bundle 1054*d*, which includes "country," only having four values, and also having "city," in which every value is unique, providing a cardinality of ten, which is the maximum for the table 800, which only has ten rows 820. One consequence of having diverse cardinalities in a single bundle is, because bundles are ordered by ascending cardinality of the lower cardinality column in the group, a column that has a lower cardinality may be used for ordering after a column that has a higher cardinality. While in some cases this effect can still provide good results, such as if there is strong correlation within a bundle and little correlation between bundles, or if there are only a small number of bundles with highly correlated data, in other cases it can provide results that are less optimal than could be obtained using other ordering techniques.

One way of adjusting the ordering of data subsets, continuing to use tables as a particular example, is to break correlation bundles into smaller bundles based on the cardinality of the columns within the group. In this way, columns that have highly divergent cardinalities can be split into separate groups (which can include a single column, in some cases).

Various techniques can be used to determine when cardinalities within a bundle are sufficiently different that they should be split into separate bundles. Logarithmic grouping can be used to provide bundles that balance ordering based on low-high cardinality while keeping correlated columns in the same bundle. FIG. 11 provides pseudocode 1100 for an example of this technique, which is referred to as "correlation bundles with logarithmic grouping." However, this technique can be adapted to use other criteria for when a bundle should be split into multiple bundles, including based on cardinality.

Correlation bundles are determined as described above, including in the pseudocode 900 of FIG. 9. Columns within correlation bundles that include multiple columns are grouped by taking the floor value of the log of their cardinalities. For example, a column with 110 distinct values would group with other columns having a value of "2," a column with 1053 values would be grouped with other columns having a value of "3," etc. The technique can be adjusted to account for variability in the cardinality of the columns in the table being considered. For example, if cardinalities are more uniform (e.g., in the range of 10-1000 rather than being in the range of 2-10,000), it may be desirable to have smaller differences in cardinality result in columns being split into separate bundles.

Looking again at the pseudocode 1100, the pseudocode returns a tuple that includes an array of sorted bundles and a flattened array of bundles, representing the column permutations. As described above, once the revised set of bundles is determined, the columns within a given bundle can be ordered by cardinality, and bundles can then be ordered by cardinality, such as by increasing cardinality based on the column in each bundle having the lowest cardinality.

This technique can be illustrated using a small change to the hypothetical described above. Consider that the table 800 includes 1,000 rows, and that the cardinalities of the columns are determined to be that "four wheel drive" has a cardinality of two, "country" has a cardinality of fifty, "city" has a cardinality of twelve-hundred, "time zone" has a cardinality of ten, and "color" has a cardinality of fifteen. Assuming that the correlations between the columns are unchanged compared with the example described above, only a single bundle contains multiple columns—the bundle 1054*d*.

Now, the current technique considers whether the bundle 1054*d* should be further subdivided into additional bundles. Based on the values provided above, "country" would have value of one, and would be grouped with any other columns having a floor cardinality value of one. "City" would have a value of three, and would be grouped with any other columns having a floor cardinality value of three. "Time zone" has a value of one, and is therefore grouped in the same bundle as "country." The result of this analysis is that bundle 1054*c* is split into two bundles, one with "country" and "time zone" and another with only "city."

The resulting bundles can then be ordered as described above. "Four wheel drive" is ordered first, followed by "country," "time zone," "color," and "city." Note that, compared with the ordering obtained using the "correlation bundles" technique, this grouping places the higher-cardinality "city" column as the last column used to determine a row ordering sequence, rather than being the fourth out of five ordering criteria.

In some cases, the cardinality of a column may not be an accurate indicator of how compressible the column may be. Accordingly, techniques that order columns based on cardinality can provide less optimal results in some cases than other techniques. Accordingly, the above-described techniques can be adapted to include ordering by compressibility rather than ordering by cardinality. So, the "order by ascending cardinality" technique, can instead be "order by ascending compressibility." For the "correlation bundles" technique, for one or both of ordering within bundles or ordering of bundles, compressibility can be used as the ordering criteria rather than cardinality.

For the "correlation bundles with logarithmic grouping," the technique can be adapted so that one of both of (1) columns can be ordered within a correlation bundle (including a correlation bundle formed by splitting another correlation bundle based on grouping criteria); or (2) ordering of bundles is based on compression size, rather than cardinality. Similarly, splitting of bundles can be based on compression size, rather than based on cardinality (e.g., the log of compression size can be used rather than the log of cardinality).

FIG. 12 provides pseudocode 1200 of how compression size can be used in place of cardinality for the "correlation bundles with logarithmic grouping" technique. The technique is generally similar to the "correlation bundles with logarithmic grouping" technique. However, after correlation bundles are evaluated to be subdivided by the logarithm of their cardinality, the columns within the resulting groups are ordered by ascending compression size, rather than by ascending cardinality.

Example 7—Example Data Structures that Facilitate Retrieval of Selected Compressed Data The present disclosure provides a technique that can be used to store run-length encoding information a way that can reduce the needed storage space, but also facilitate the retrieval of data for individual rows in the table. That is, Example 4 described that run-length encoding information can be stored in a run-store format, which can provide better compression, or a location-store format, which typically requires more space than run-store compression data, but allows for individual values to be retrieved more easily.

One can use bit-packing to store value identifiers; this approach uses the minimum number of bits needed for each identifier. This method can be used for value identifiers, run-length, and row positions for each run of a column. In other words, every value identifier is documented using the same number of bits and every row position is encoded using the same number of bits. The run-length encoding variant which stores row positions can be advantageous in that performing value ID mapping to row position is efficient. For a row position pos, a binary search to identify its value identifier can be performed with time $O(\log (n_r))$. That is, the list of row positions can be searched until the bin that contains the row position pos is located. Taking the example of table 360 of FIG. 3, if row position 4 is of interest, we can identify the bin starting at position 3 as containing row position 4, since the next bin starts with row position 7.

However, using run-length encoding that stores run-length, rather than row position, up to pos additions typically need to be performed to incrementally find the proper value at a given row position. This is because the row positions are encoded relative to the previous encoded row position. That is, say row position 7 is again of interest, but we use the table 330 of FIG. 3 for encoding. In order to find the value of position 7, the value of the runs must be added up until position 7 is reached. So, since bin 1 contains 3 positions, it is known that at least the next bin run-length must be added to 3 to determine if position 7 is within the next bin. In this example, the bin size, or run-length, of the first run is 3, the bin size of the second run is 4, indicating that position 7 is indeed in the second bin, which allows the value ID of 1 to be determined for position 7. It can be seen that if a high row position was of interest, a greater number of additions would be needed, up to the value of the row position of interest (assuming that every value ID had a run-length of one).

Searching for a particular row position in a run store has $O(n_r)$ time complexity. Therefore, location-store run-length encoding is more friendly for search, due to better time complexity. Some systems, such as SAP HANA, of SAP SE, of Walldorf, Germany, use location-store run-length encoding in order to speed retrieval of individual row values, even though this technique may result in lower compression than using run-store run-length encoding.

Let $b(x)$ be the number of bits required to represent value x. For an equal number of runs, each row position is encoded in $b(n_r)$ bits whereas runs are encoded in $b(\text{longest\_run}(c_i))$, number of bits, and $\text{longest\_run}(c_i)$ is always less than or equal to $n_r$. If there are large number of distinct values, it is less likely that long runs will exist. Therefore, with large number of runs, $\text{longest\_run}(c_i)$ is expected to be small.

The preset disclosure provides a hybrid data structure that encodes compression information in a run-store, which can allow for greater compression of run-length encoding data. However, an auxiliary data structure stores indexes, or row primers, to selected row positions in the run-length store, creating virtual partitions of the run-length store. This auxiliary data structure can be referred to as the "row position primer store," and can be stored in memory (as can the, likely compressed, run-length store) The hybrid data structures can provide both the searchability of location-store run-length encoding and the space compressibility of run-store run-length encoding.

A value cap, which can be user-defined, is the maximum number of additions to apply to row positions. When a column is compressed using run-store-based run-length encoding, a counter is used that takes into account the corresponding row position in the auxiliary structure. When accessing the value identifier at row position pos, the closest row position primer is found using binary search and the pointer is followed to the row position run in the column, guided by the primer's row position. Addition is applied to retrieve the correct row position.

The row position primer is used because addition is very fast, hence appropriate row position can be constructed efficiently. This method can be friendly to in-memory based columns as it trades CPU speed to gain better compression.

Performing binary search on the row position primer costs logarithmic time, and constructing row position requires at most cap additions. Therefore, the time complexity of random access is $O(\log(n_r)+\text{cap})$, and the space capacity for the row position primer is $O(\log(n_r)*\text{runs}/\text{cap})$.

Figure 13:
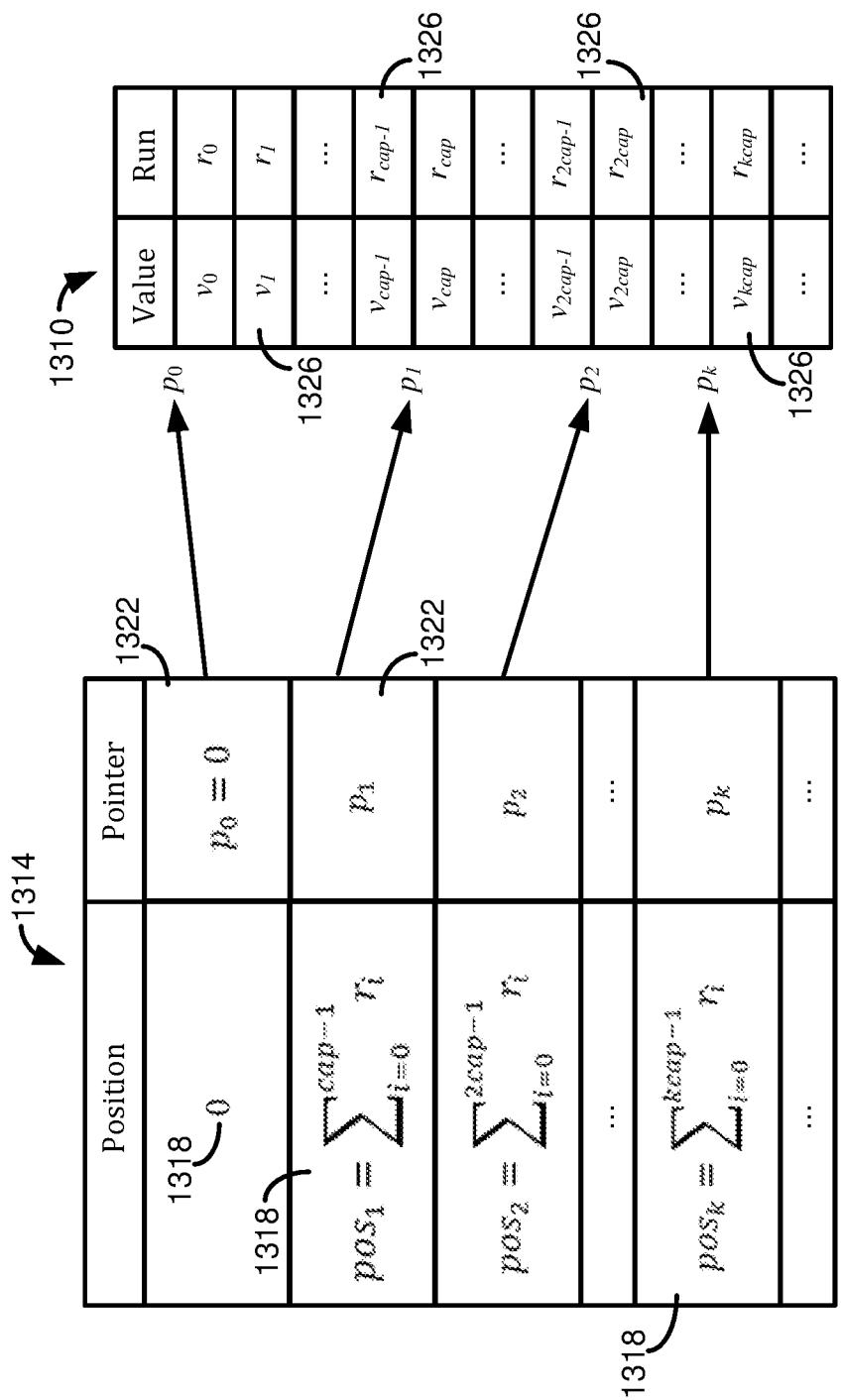
FIG. 13 is a diagram illustrating data structures that can be used to facilitate retrieving a particular value in run-store encoded run-length compression data.

FIG. 13 illustrates exemplary hybrid data structures, including a run-store 1310 and an auxiliary data structure 1314, or row primer store. The run-store 1310 is analogous to the run-store 330 of FIG. 3. The auxiliary data structure 1314 stores row position primers 1318 for a row corresponding to the last row of a collection of rows defined by the cap value. For each row position primer 1318, the auxiliary data structure 1314 stores a logical pointer 1322 that points to a row 1326 of the run-store 1310 that corresponds to the first row in the next collection of rows defined by the value cap (e.g., directs to a first row in a position group). Groups of rows can be referred to as position groups (e.g., rows 100-199 can be a position group), and a logical pointer, corresponding to a row primer, can make the first row in the given position group a next row to be analyzed (e.g., the row primer for row 100 makes row 100 the next row to be analyzed after the logical pointer is dereferenced).

As a more concrete example, consider that a table includes 500 rows, and that the cap is set to 100 rows. Row position primers 1318 would be created for multiples of the cap until at least the number of rows in the table would be accommodated. In this case, since 500 rows are present, 500 rows/100 rows per row position primer 1318 provides that five row positions are needed in the auxiliary data structure 1314, where at least row positions beyond the first (which can be assumed to start at the first position of the run-store 1310) are associated with a pointer 1322 to a row 1326 of the run-store. The row position primers 1318 in this example would correspond to 0 (for a row position provides a pointer for rows 0-99), 99 (which provides a pointer for rows 100-199), 199 (which provides a pointer for rows 200-299), 299 (providing a pointer for rows 300-399), and 399 (providing a pointer for rows 400-499).

When a given row is to be accessed then, a maximum of cap additions will be needed to access the value ID for that row in the run-store 1310. For example, if row 404 were specified, the auxiliary data structure 1314 can be searched to find that row 400 is the closest row position primer for row 404, and the pointer for row 399 can be followed to the run-store 1310 (so that the next row to be searched will be row 400). The run-store can 1310 can then be searched for row 404 as usual, but a maximum of four additions would be needed to iterate from row 400 to row 404, which would be the case if each run from row 400 to row 404 was of length one. In contrast, using a traditional run-store 1310, locating the value ID for row 404 could take up to 404 additions.

Example 8—Example Technique for Determining Compressed Table Size

As discussed in Example 5, disclosed techniques can evaluate tables for compression, and produce a primary set of columns that are to be compressed, and a secondary set of columns that will not be compressed (at least using a particular compression technique currently under consideration). A table having both compressed and uncompressed columns can be represented as a list of two items. The first item is a list of compressed columns and the second item is a list that represents the uncompressed columns.

Figure 14:
FIG. 14 is a table used in describing a technique for calculating a size of a compressed table.

FIG. 14 illustrates an example table 1400 that is used as an example to explain the representation described above. For the table 1400, is columns 1 and 2 are to be compressed, and columns 3 and 4 are to be left uncompressed, the overall table can be represented as:

[[(1,3), (3,1), (2,2), (0,1)], [(5,4), (6,3)]], [[1,5,3,2,6,0,4], [4,0,1,2,4,3,5]]]

Instead of having the minimum number of runs as a cost function, a cost function can use the total number of bits needed to encode the compressed columns. Another representation of the table, which can be more easily used for size computations, is:

[4,1,3,3,1,2,2,0,1,2,5,4,6,3,*,1,5,3,2,6,0,4,4,0,1,2,4,3,5]

For the first primary column, an indicator is included of how many pairs (of compression information, such as value IDs and run-length) should be read until the data for that primary column is complete. This indicator is followed by the value IDs and runs represented in pairs of integers. This process is repeated for all primary columns. A delimiter, such as "*," can be used to indicate where in the data a switch occurs from primary columns to secondary columns After the delimiter, the values (uncompressed) in the secondary columns are appended to the file. The size of this indicator (8 bits) is also included in the total size needed to represent a table in the above format.

Example 9— Example Table Compression Process

Figure 15:
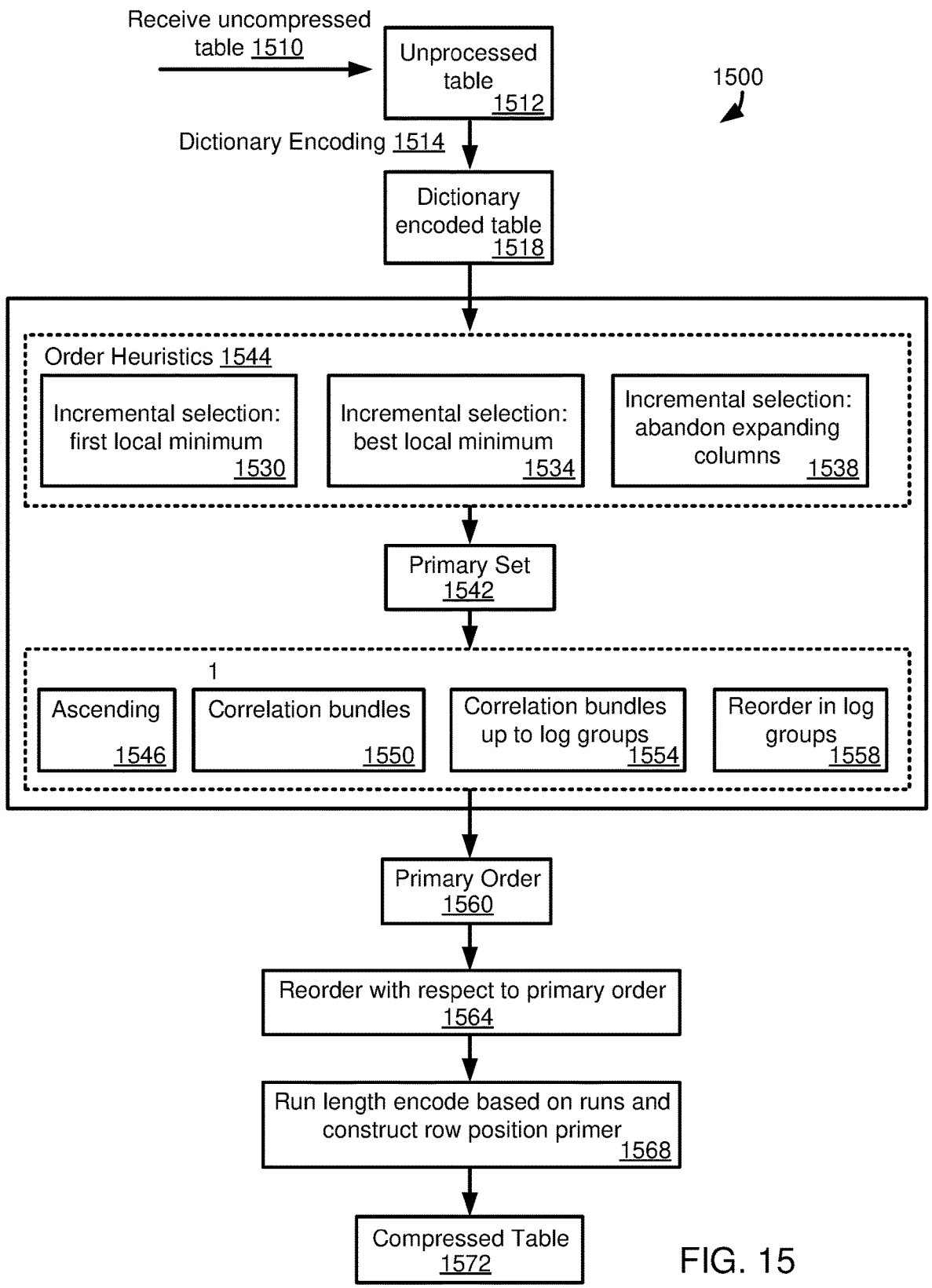
FIG. 15 is a diagram illustrating a process for compressing at least a portion of data in a table maintained in a column-store format.

FIG. 15 is a flowchart of an example process 1500 that can use one or more techniques described in the presented disclosure. The process 1500 is described in the context of processing a table in a relational database system, where the table is maintained in a column-store format. However, the process 1500 can be implemented in analogous manner for other types of data.

At 1510, an unprocessed table 1512 is received. The unprocessed table 1512 can be converted to a dictionary encoded table 1518 using a dictionary encoding technique 1514, such as the technique described in Example 2. Note that the process 1500 can be carried out with a table that has not been dictionary encoded, including using the unprocessed table 1512. For example, run-length encoding can be carried out on a table that has not already been dictionary-compressed, even though the overall compression of the table may be greater if both dictionary encoding and run-length encoding (or another compression technique) were used. Similarly, any prior processing of the unprocessed table 1512 can be carried out outside of the process 1500, such that the process can begin at 1514.

The dictionary encoded table 1518 can be partitioned into a set of primary columns and a set of secondary columns, where the set of secondary columns can optionally be the empty set. That is, even if it is determined that all columns would benefit from compression, the columns can still be evaluated to determine a column order that should be used for reordering rows of the table to provide improved compression, as will be further described.

Partitioning the dictionary encoded table 1518 into primary and secondary sets of columns can include evaluating the table using one or more of the partitioning techniques (or heuristics) 1522 described in Example 5—first local minimum 1530, best local minimum 1534, and best local minimum with abandon expanding columns 1538. In some cases, the process 1500 is configured to use a particular primary column selection technique. In other cases, the process 1500 can be configured to evaluate a plurality of techniques, and the technique that provides the best result can be selected for use. In yet further cases, the nature of the data set can influence what primary column selection technique should be used for that data set.

The result of analyzing the dictionary compressed table 1518 using one or more of the techniques 1530-1538 is a set of primary columns 1542. The set of primary columns 1542 can then be evaluated to determine a sequence of the primary columns that should be used in ordering the rows of the table, as described in Example 6. Determining an order for the set of primary columns 1542 can include analyzing one or more ordering techniques (or heuristics) 1544, including ordering the set by ascending cardinality 1546, ordering the set using correlation bundles 1550, ordering the set using correlation bundles with logarithmic grouping 1554, or using correlation bundles with logarithmic grouping and reordering at least a portion of the primary columns by ascending compressed column size 1558. In some cases, the process 1500 is configured to use a particular primary column ordering technique. In other cases, the process 1500 can be configured to evaluate a plurality of ordering techniques, and the ordering technique that provides the best result can be selected for use. In yet further cases, the nature of the data set can influence what primary column ordering technique should be used for that data set.

Although the process 1500 has been described as included both a primary column selection technique and a primary column ordering technique, in other implementations, a process only includes one of these techniques. That is, all columns in a table can be ordered without evaluating whether some columns may not benefit from compression. Or, a primary set of columns can be determined, but it need not be considered whether additional benefits may be gained by reordering the primary column.

After primary column selection and reordering, an order 1560 or sequence of primary columns is determined. The rows of the table can be reordered at 1564 using the order 1560. Typically, the rows are reordered in an identical manner for all columns of the tables—both primary columns and secondary columns, so that row information for the table in maintained, even if the row order differs from the order in the original table. At 1568, the columns of the reordered table can be run-length encoded, including using the hybrid data structure described in Example 7.

Typically, each column being compressed is run-length encoded separately, and stored in a separate file. The file can include, such as in a header, compression information for the column, including the hybrid data structure (or other format for storing compressing information) for that column, and optionally including an identifier of a dictionary to be used with the column, assuming that the column has been dictionary compressed. The result of the compression produces an at least partially compressed table 1572.

Example 10— Example Implementation and Results Using Disclosed Techniques for Selecting Table Columns for Compression and Determining Column Order for Sorting Table Rows Disclosed technologies were evaluating using the dataset used in Lemire, et al., "Reordering Columns for Smaller Indexes," Information Sciences—Informatics and Computer Science, Intelligent Systems, Applications: An International Journal, vol. 181, no. 12, pp. 2550-2570, 2011, which is incorporated by reference herein to the extent not inconsistent with the present disclosure. This reference is referred to for ease of reference as "Lemire." Three datasets were used in Lemire: Wikileaks (1,193,247 rows and 4 columns), Census (199,523 rows and 42 columns), and Weather (1,015,367 rows and 19 columns). An implementation of the disclosed technologies was created in Python 2.7.15 with Pandas 0.25 and NumPy 1.17. The size of compressed columns was calculated as described in Example 8.

RLE with Row Positions Vs RLE with Run-Lengths

Figure 16:
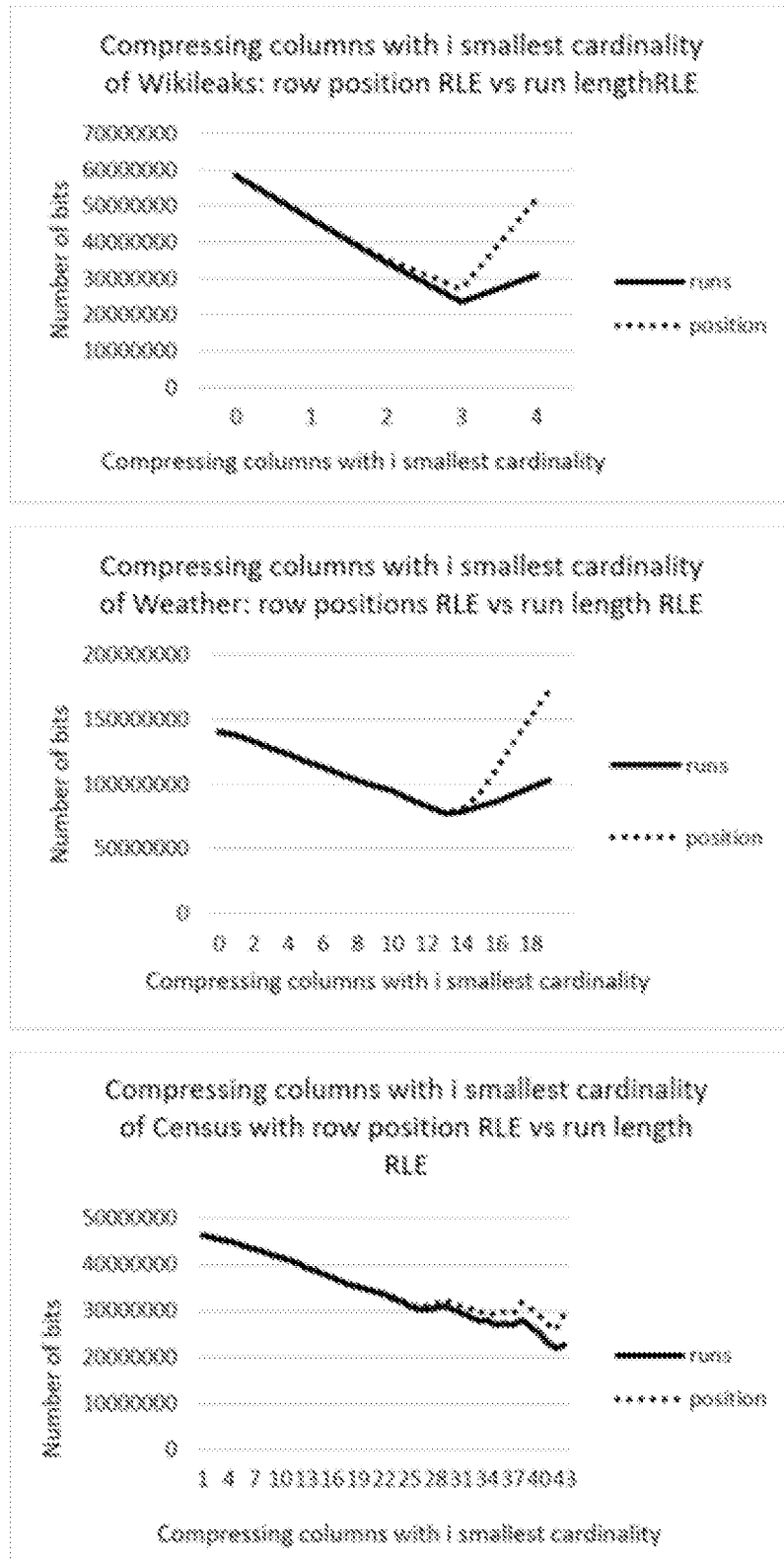
FIG. 16 is graphs of compression results of various data sets using location-store run-length compression or run-store run-length compression as additional columns are included in a set of columns being compressed.

In this study, the impact of using run-lengths versus row positions was compared for the three datasets (FIG. 16). Columns were ordered by cardinality, and the size of compressed table determined, after adding columns one-by-one. For all datasets, adding one more column result into a smaller table. In both approaches, run-length encoding yielded similar numbers of bits in the compressed table when the first two-thirds of the columns were compressed. When only the first few columns are compressed, the size of secondary columns dominates the overall size of the compressed tables.

The best local minimum technique for determining column order (as described in Example 5) was defined as the optimal point. At the optimal compression point of the Wikileaks dataset (compressing first 3 columns), compression with run-length was 14.17% smaller than that for compressing with row positions. For the Weather dataset, the optimal point is when the first 13 columns are compressed, where compressing by run-length is 0.86% smaller than by row position. With the Census dataset, the reduction was 15.51%. A bigger difference was observed between the two approaches when all columns were compressed; 40.64%, 40.14%, and 23.56%, for the Wikileaks, the Weather, and the Census data sets, respectively.

These results indicate that compression by run-length was superior to compression by row position, because of the smaller number or bits required to encode each run, as opposed to the positions.

FIG. 17 illustrates the impact of the two compression approaches on the compression of the primary columns. The ratio of primary size was determined after the two algorithms were applied, where a ratio smaller than one is more desirable. This is an accurate projection of how effective run-store RLE is compared to location-stored RLE, because the equal contribution of the secondary columns is ignored.

After the first column, it was observed that the size of run-based RLE primary column was strictly less than that of row position, by at least 7%. In addition, this ratio decreased monotonically with the number of columns added. This may be because adding more columns naturally results into adding more runs, which have smaller lengths and need a smaller number of bits, as compared with a constant number of bits for the row positions approach.

Primary Partitioning

The effect of various techniques for partitioning a table into primary and secondary columns was evaluated. The evaluation included assessing the incremental improvement provided by adding additional columns to the set of primary columns, as well as whether adding additional columns to the set of primary columns reduced overall compression efficiency. The size of the set of primary columns was almost insignificant compared to size of the set of secondary columns in the beginning of the evaluation. Then, the size of the set of primary columns eventually became large towards the end of the process of evaluating columns in the table.

Figure 18:
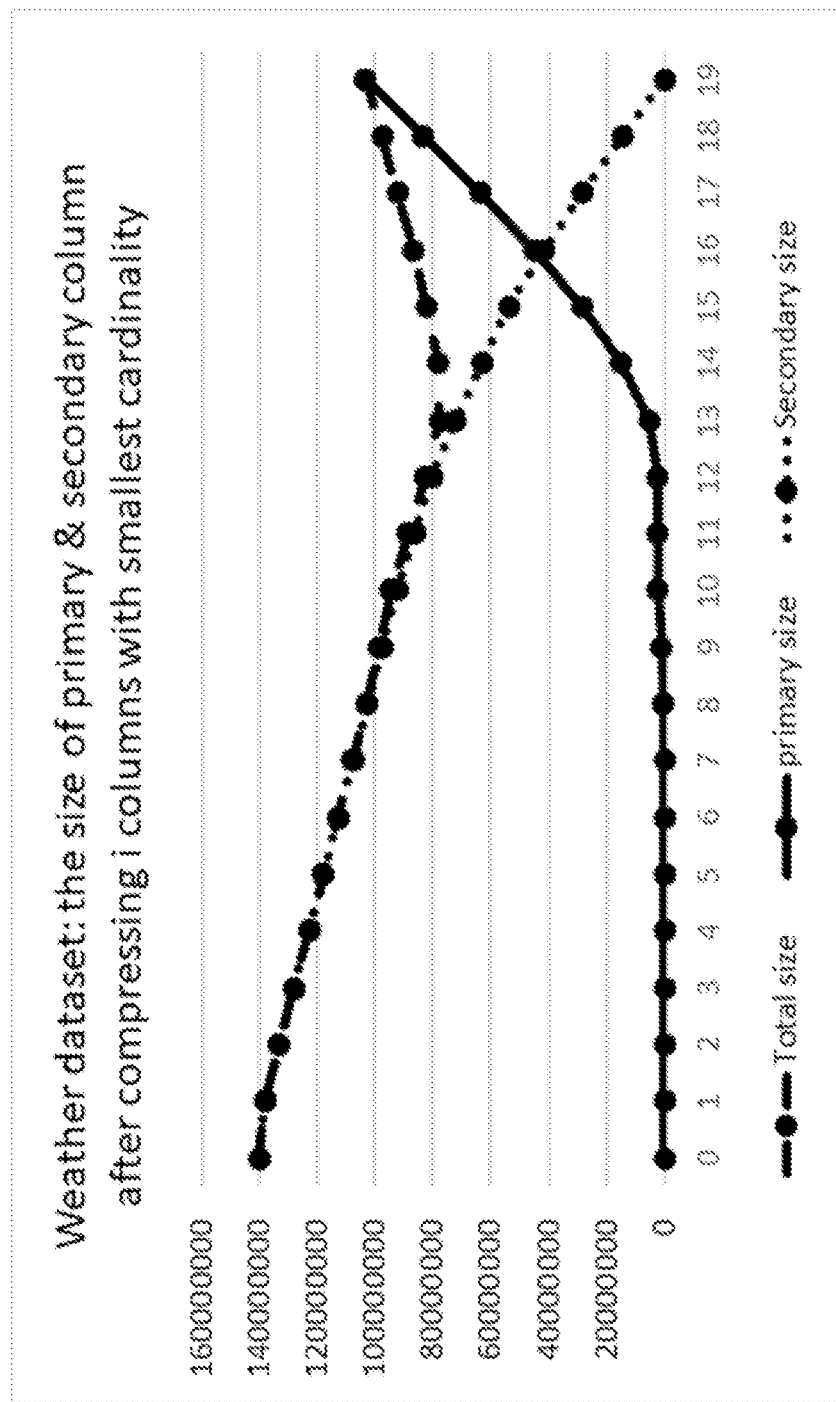
FIG. 18 is a graph illustrating a total size for table data, a size for compressed columns of the table, and a size for uncompressed columns of the table as additional columns are added to a set of compressed table columns.

As shown in FIG. 18, in the beginning, the size of the set of primary columns increased at a small rate compared to the steady rate by which the size of the set of secondary columns decreased. As more columns were compressed, towards the end of the process of evaluating columns in the table (between adding 15-19 columns), the size of the primary set of columns increased at a larger rate compared to the rate of decrease in size of the set of secondary columns. This result can be attributed to the decrease in value ID locality.

Primary Selection Algorithms

The primary column selection algorithms described in Example 5 and 6 were evaluated, namely Compress All (CA), First Local Minimum (FLM), Best Local Minimum (BLM), and Abandon Expanding Columns (AEC). Out of all these three datasets, as depicted in FIG. 17, from no compression to compress all, the size decreases first until the global minimum, and then increases afterwards. Then, if the smallest point on the graph is chosen, the size is already much smaller than the two extremes (no compression or compress all). As the table of FIG. 19 demonstrates, for the Wikileaks dataset, the best local minimum yielded a compression size that is 40.02% compared to 'no compression' and 75.40% compared to 'compress all'.

For the Wikileaks and the Weather datasets, the compression size that the corresponding best local minimum yields is significantly smaller than both 'compress all' and 'no compression'. The Census dataset has a large number of columns (42 columns) and a diverse value distribution among its columns might be expected. From FIG. 16, it can be observed that 1) multiple local minimums can be present, and 2) the size of the compressed columns set increased when new columns were added. This pattern can happen for tables with large number of columns. Stopping at the first local minimum in the Census dataset provides less optimal results than 'compress all' because the algorithm stopped too early. After the final column added be the first local minimum technique, there are more columns that can provide compressibility. Note that if any columns that can yield an increase in compression (AEC) are abandoned, a much smaller compression size can be obtained than if there are many of them. In the Census dataset, using the AEC approach, the size of compression can be reduced by an additional 15.10% compared to the best local minimum.

Primary Ordering

The table of FIG. 20 presents results from evaluating different column ordering techniques. Only the primary column sizes are shown in this table. The baseline was the primary set of columns chosen from the best local minimum. The correlation grouping, correlation grouping with logarithmic grouping, and correlation groups with logarithmic grouping and ordering by compression size techniques were compared with ordering columns by ascending or descending cardinality. Ordering using ascending cardinality and the three variants of correlation grouping provided generally similar results. The column in the set of primary columns appear to serve as a bottleneck for compression. When compression was carried out for all permutations of the primary columns in the Census dataset, the best permutation observed was only 3% better than one derived by ascending cardinality. Typically, it would be impractical to consider all permutations the primary columns in a table, as it would be computationally expensive no evidence was observed that such an exhaustive approach would provide a result with significantly better compression than that obtained by ordering by ascending cardinality.

However, it should be appreciated that the benefit of primary column selection techniques and column ordering techniques may depend on the nature of the data set. That is, while the three variants of the correlation bundles technique did not provide a significant advantage with the data sets evaluated in this study, other data sets may have properties where correlation bundle techniques may provide better compression than using ascending cardinality.

Example 11—Example Database Environment

Figure 21:
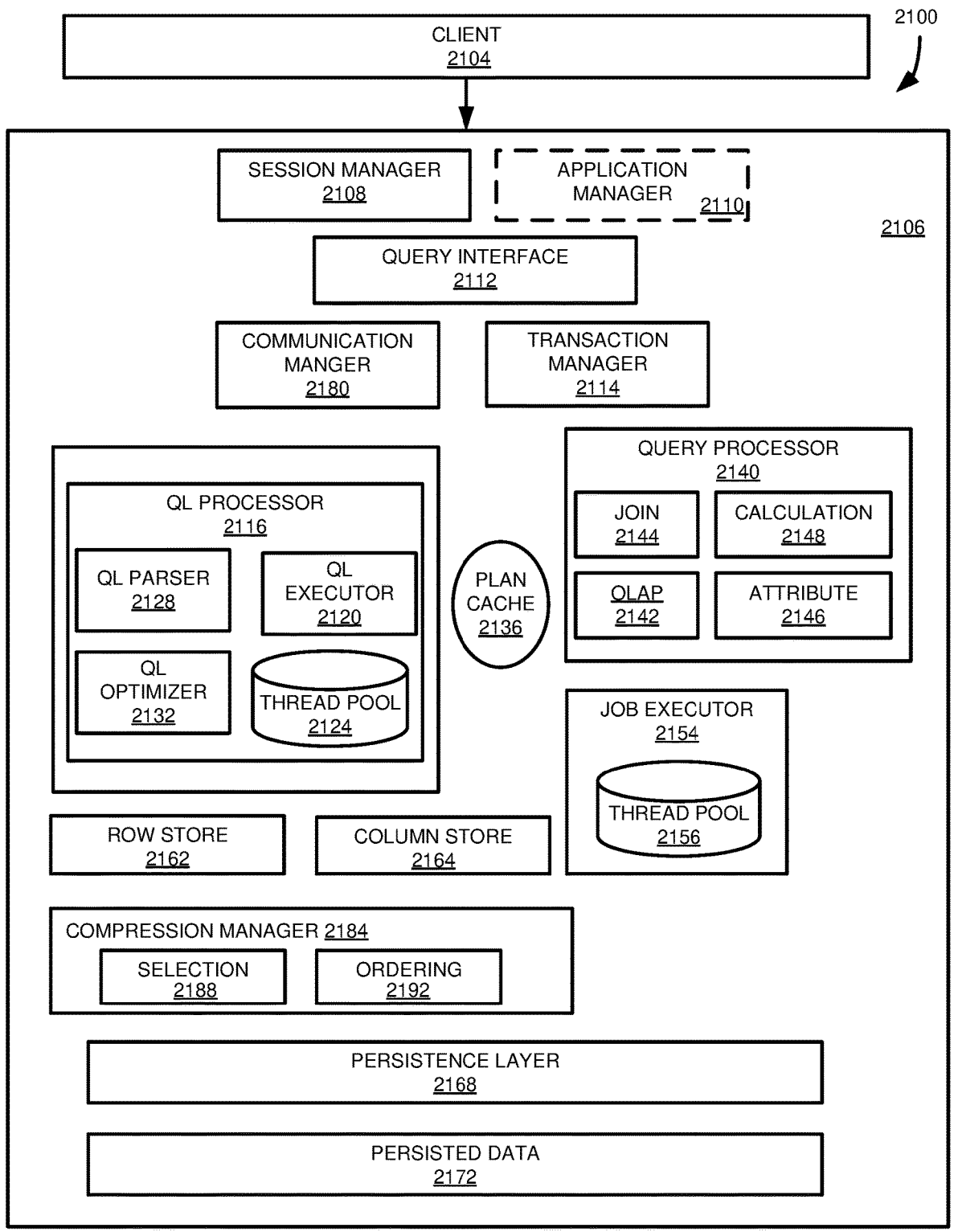
FIG. 21 is block diagram of an example database environment in which disclosed technologies can be implemented.

FIG. 21 illustrates an example database environment 2100 in which disclosed technologies can be implemented. The database environment 2100 can include a client 2104. Although a single client 2104 is shown, the client 2104 can represent multiple clients. The client or clients 2104 may be OLAP clients, OLTP clients, or a combination thereof.

The client 2104 is in communication with a database server 2106. Through various subcomponents, the database server 2106 can process requests for database operations, such as requests to store, read, or manipulate data. A session manager component 2108 can be responsible for managing connections between the client 2104 and the database server 2106, such as clients communicating with the database server using a database programming interface, such as Java Database Connectivity (JDBC), Open Database Connectivity (ODBC), or Database Shared Library (DBSL). Typically, the session manager 2108 can simultaneously manage connections with multiple clients 2104. The session manager 2108 can carry out functions such as creating a new session for a client request, assigning a client request to an existing session, and authenticating access to the database server 2106. For each session, the session manager 2108 can maintain a context that stores a set of parameters related to the session, such as settings related to committing database transactions or the transaction isolation level (such as statement level isolation or transaction level isolation).

For other types of clients 2104, such as web-based clients (such as a client using the HTTP protocol or a similar transport protocol), the client can interface with an application manager component 2110. Although shown as a component of the database server 2106, in other implementations, the application manager 2110 can be located outside of, but in communication with, the database server 2106. The application manager 2110 can initiate new database sessions with the database server 2106, and carry out other functions, in a similar manner to the session manager 2108.

The application manager 2110 can determine the type of application making a request for a database operation and mediate execution of the request at the database server 2106, such as by invoking or executing procedure calls, generating query language statements, or converting data between formats useable by the client 2104 and the database server 2106. In particular examples, the application manager 2110 receives requests for database operations from a client 2104, but does not store information, such as state information, related to the requests.

Once a connection is established between the client 2104 and the database server 2106, including when established through the application manager 2110, execution of client requests is usually carried out using a query language, such as the structured query language (SQL). In executing the request, the session manager 2108 and application manager 2110 may communicate with a query interface 2112. The query interface 2112 can be responsible for creating connections with appropriate execution components of the database server 2106. The query interface 2112 can also be responsible for determining whether a request is associated with a previously cached statement or a stored procedure, and calling the stored procedure or associating the previously cached statement with the request.

At least certain types of requests for database operations, such as statements in a query language to write data or manipulate data, can be associated with a transaction context. In at least some implementations, each new session can be assigned to a transaction. Transactions can be managed by a transaction manager component 2114. The transaction manager component 2114 can be responsible for operations such as coordinating transactions, managing transaction isolation, tracking running and closed transactions, and managing the commit or rollback of transactions. In carrying out these operations, the transaction manager 2114 can communicate with other components of the database server 2106.

The query interface 2112 can communicate with a query language processor 2116, such as a structured query language processor. For example, the query interface 2112 may forward to the query language processor 2116 query language statements or other database operation requests from the client 2104. The query language processor 2116 can include a query language executor 2120, such as a SQL executor, which can include a thread pool 2124. Some requests for database operations, or components thereof, can be executed directly by the query language processor 2116. Other requests, or components thereof, can be forwarded by the query language processor 2116 to another component of the database server 2106. For example, transaction control statements (such as commit or rollback operations) can be forwarded by the query language processor 2116 to the transaction manager 2114. In at least some cases, the query language processor 2116 is responsible for carrying out operations that retrieve or manipulate data (e.g., SELECT, UPDATE, DELETE). Other types of operations, such as queries, can be sent by the query language processor 2116 to other components of the database server 2106. The query interface 2112, and the session manager 2108, can maintain and manage context information associated with requests for database operation. In particular implementations, the query interface 2112 can maintain and manage context information for requests received through the application manager 2110.

When a connection is established between the client 2104 and the database server 2106 by the session manager 2108 or the application manager 2110, a client request, such as a query, can be assigned to a thread of the thread pool 2124, such as using the query interface 2112. In at least one implementation, a thread is associated with a context for executing a processing activity. The thread can be managed by an operating system of the database server 2106, or by, or in combination with, another component of the database server. Typically, at any point, the thread pool 2124 contains a plurality of threads. In at least some cases, the number of threads in the thread pool 2124 can be dynamically adjusted, such in response to a level of activity at the database server 2106. Each thread of the thread pool 2124, in particular aspects, can be assigned to a plurality of different sessions.

When a query is received, the session manager 2108 or the application manager 2110 can determine whether an execution plan for the query already exists, such as in a plan cache 2136. If a query execution plan exists, the cached execution plan can be retrieved and forwarded to the query language executor 2120, such as using the query interface 2112. For example, the query can be sent to an execution thread of the thread pool 2124 determined by the session manager 2108 or the application manager 2110. In a particular example, the query plan is implemented as an abstract data type.

If the query is not associated with an existing execution plan, the query can be parsed using a query language parser 2128. The query language parser 2128 can, for example, check query language statements of the query to make sure they have correct syntax, and confirm that the statements are otherwise valid. For example, the query language parser 2128 can check to see if tables and records recited in the query language statements are defined in the database server 2106.

The query can also be optimized using a query language optimizer 2132. The query language optimizer 2132 can manipulate elements of the query language statement to allow the query to be processed more efficiently. For example, the query language optimizer 2132 may perform operations such as unnesting queries or determining an optimized execution order for various operations in the query, such as operations within a statement. After optimization, an execution plan can be generated, or compiled, for the query. In at least some cases, the execution plan can be cached, such as in the plan cache 2136, which can be retrieved (such as by the session manager 2108 or the application manager 2110) if the query is received again.

Once a query execution plan has been generated or received, the query language executor 2120 can oversee the execution of an execution plan for the query. For example, the query language executor 2120 can invoke appropriate subcomponents of the database server 2106.

In executing the query, the query language executor 2120 can call a query processor 2140, which can include one or more query processing engines. The query processing engines can include, for example, an OLAP engine 2142, a join engine 2144, an attribute engine 2146, or a calculation engine 2148. The OLAP engine 2142 can, for example, apply rules to create an optimized execution plan for an OLAP query. The join engine 2144 can be used to implement relational operators, typically for non-OLAP queries, such as join and aggregation operations. In a particular implementation, the attribute engine 2146 can implement column data structures and access operations. For example, the attribute engine 2146 can implement merge functions and query processing functions, such as scanning columns.

In certain situations, such as if the query involves complex or internally-parallelized operations or sub-operations, the query executor 2120 can send operations or sub-operations of the query to a job executor component 2154, which can include a thread pool 2156. An execution plan for the query can include a plurality of plan operators. Each job execution thread of the job execution thread pool 2156, in a particular implementation, can be assigned to an individual plan operator. The job executor component 2154 can be used to execute at least a portion of the operators of the query in parallel. In some cases, plan operators can be further divided and parallelized, such as having operations concurrently access different parts of the same table. Using the job executor component 2154 can increase the load on one or more processing units of the database server 2106, but can improve execution time of the query.

The query processing engines of the query processor 2140 can access data stored in the database server 2106. Data can be stored in a row-wise format in a row store 2162, or in a column-wise format in a column store 2164. In at least some cases, data can be transformed between a row-wise format and a column-wise format. A particular operation carried out by the query processor 2140 may access or manipulate data in the row store 2162, the column store 2164, or, at least for certain types of operations (such a join, merge, and sub-query), both the row store 2162 and the column store 2164. In at least some aspects, the row store 2162 and the column store 2164 can be maintained in main memory.

A persistence layer 2168 can be in communication with the row store 2162 and the column store 2164. The persistence layer 2168 can be responsible for actions such as committing write transaction, storing redo log entries, rolling back transactions, and periodically writing data to storage to provided persisted data 2172.

In executing a request for a database operation, such as a query or a transaction, the database server 2106 may need to access information stored at another location, such as another database server. The database server 2106 may include a communication manager 2180 component to manage such communications. The communication manger 2180 can also mediate communications between the database server 2106 and the client 2104 or the application manager 2110, when the application manager is located outside of the database server.

In some cases, the database server 2106 can be part of a distributed database system that includes multiple database servers. At least a portion of the database servers may include some or all of the components of the database server 2106. The database servers of the database system can, in some cases, store multiple copies of data. For example, a table may be replicated at more than one database server. In addition, or alternatively, information in the database system can be distributed between multiple servers. For example, a first database server may hold a copy of a first table and a second database server can hold a copy of a second table. In yet further implementations, information can be partitioned between database servers. For example, a first database server may hold a first portion of a first table and a second database server may hold a second portion of the first table.

In carrying out requests for database operations, the database server 2106 may need to access other database servers, or other information sources, within the database system. The communication manager 2180 can be used to mediate such communications. For example, the communication manager 2180 can receive and route requests for information from components of the database server 2106 (or from another database server) and receive and route replies.

The database system 2100 can include a compression manager 2184. The compression manager 2184 can be used to compress data in the database system 2100, including data stored in the column store 2164. In particular, the compression manager 2184 can include a selection component 2188. The selection component 2188 can be used to evaluate columns of a table to be stored in the column store 2164 to determine a primary set of columns that should be compressed, and optionally a secondary set of columns that should be stored uncompressed. The selection component 2188 can use techniques described in Example 5.

The compression manager 2184 can include an ordering component 2192. The ordering component 2192 can determine an order of columns of the table that should be used to order rows of the table, across, the table columns, that will provide beneficial compression for a set of columns to be compressed. The ordering component 2192 can use one or more of the techniques described in Example 6.

The compression manager 2184 can also include, and apply, algorithms to compress data, including dictionary compression or run-length encoding. When data is requested, such as in a query, the query processor 2140 can locate relevant data in the column store 2164 using compression information stored for a relevant column, including using the data structures of FIG. 13 to locate specific values (e.g., for a particular row) in the compressed column data.

Example 12—Example Operations Using Disclosed Compression and Data Retrieval Techniques FIG. 22 is a flowchart of a method 2200 for determining proper data subsets of a plurality of proper data subsets of a data set to be compressed. The method 2200 can incorporate techniques described in Example 5, and a particular implementation can include determining columns of a table that should be compressed using run-length encoding and columns that should be left uncompressed.

At 2204, a data set is received that includes a first plurality of proper data subsets. In a particular example, the data set is a table, and the first plurality of proper data subsets corresponds to columns of the table. Each proper data subset includes a plurality of elements of the data set, where the elements are associated with respective positions in the given proper data subset. For example, a proper data subset can include values for a plurality of rows of the table. The data elements in the columns of the table can be ordered such that a row of the table can be reconstructed by retrieving the values from the columns at the same position of the columns.

Cardinalities for the first plurality of proper data subsets are determined at 2208. Cardinality refers to the number of unique values in a proper data subset, such as the number of unique values in a given column. At 2212, the first plurality of proper data subsets are reordered by ascending cardinality. For respective proper data subsets of a second plurality of proper data subsets of the first plurality of proper data subsets, a first size is determined at 2216. At 2220, for respective proper data subsets of the second plurality of proper data subsets, the proper data subset is compressed using a first compression technique to provide a compressed proper data subset.

For respective proper data subsets of the second plurality of proper data subsets, at 2224, a second size of the compressed proper data subsets is determined. At 2228, for respective proper data subsets of the second plurality of proper data subsets that have a second size smaller than the first size, the respective proper data subset is added to a group of proper data subsets to be compressed using the first compression technique.

FIG. 23 is a flowchart of a method 2300 for determining an order to be used in compressing proper data subsets of a data set. The method 2300 can use techniques described in Example 6. In a particular example, the method 2300 can represent determining an order of table columns, where the order is used to reorder rows of the table prior to compressing at least a portion of the table columns.

At 2304, a first plurality of proper data subsets are received. The proper data subsets have a first order, and include a plurality of data elements. Data elements are associated with positions in the proper data subsets and data elements at a particular position within a given proper data subset are correlated with data elements of other proper data subsets at the given positions of the other proper data subsets. For example, a proper data subset can include values for a plurality of rows of a table. The data elements in the columns of the table can be ordered such that a row of the table can be reconstructed by retrieving the values from the columns at the same position of the columns A second order of the proper data subsets is determined as follows. A correlation value is determined, at 2308, between a first proper data subset of the first plurality of proper data subsets and a second proper data subset of the first plurality of proper data subsets. At 2312, the correlation value is compared with a threshold. It is determined at 2316 that the correlation value satisfies the threshold. At 2320, based on determining that the correlation value satisfies the threshold, the second proper data subset is added to a group that includes the first proper data subset.

Data elements of the first plurality of proper data subsets are reordered at 2324 using the second order. At 2328, data elements of at least a portion of the first plurality of proper data subsets are compressed.

Figure 24:
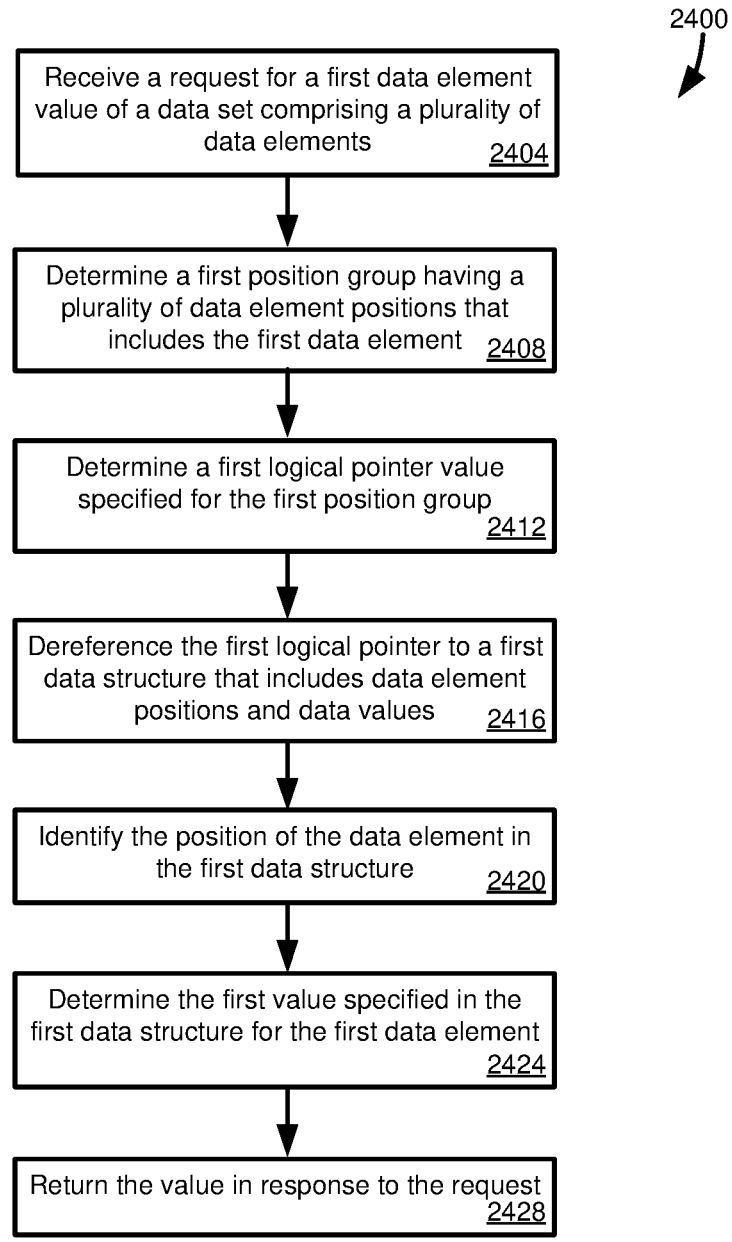
FIG. 24 is a flowchart of an example method for using a logical pointer to locate a position group starting point in a data structure that includes compressed data.

FIG. 24 is a flowchart of a method 2400 of retrieving a value for a specified data element of a data set that includes a plurality of data elements. The method 2400 can represent a method of using the run-length store 1310 and auxiliary data structure 1314 of FIG. 13, as described in Example 7. For instance, the method 2400 can be a method of retrieving a value ID for a specified row of a compressed table column.

At 2404, a request is received for a first data element value of a data set that includes a plurality of data elements. A first position group, having a plurality of data element positions, is determined at 2408 that includes the first data element value. At 2412, a first logical pointer value is determined that is specified for the first position group. The first logical pointer is dereferenced at 2416 to a first data structure that includes data element positions and data values. At 2420, a position of the first data element is identified in the first data structure. The first value, specified in the first data structure for the first data element, is determined at 2424. At 2428, the first data element value is returned in response to the request.

Example 13—Computing Systems

Figure 25:
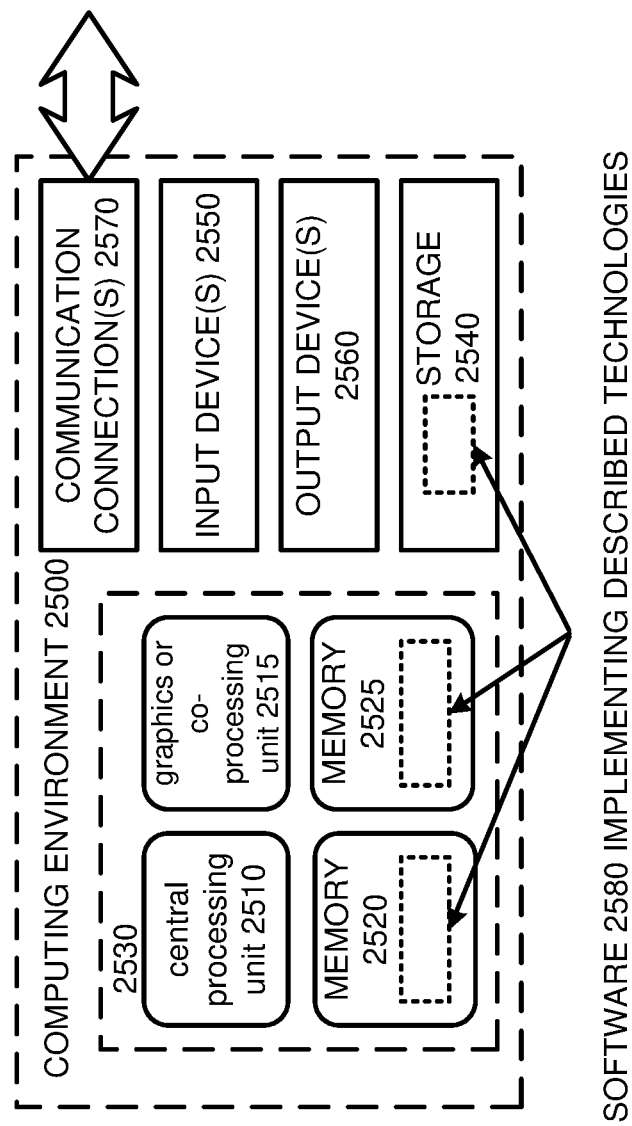
FIG. 25 is a diagram of an example computing system in which some described embodiments can be implemented.

FIG. 25 depicts a generalized example of a suitable computing system 2500 in which the described innovations may be implemented. The computing system 2500 is not intended to suggest any limitation as to scope of use or functionality of the present disclosure, as the innovations may be implemented in diverse general-purpose or special-purpose computing systems.

With reference to FIG. 25, the computing system 2500 includes one or more processing units 2510, 2515 and memory 2520, 2525. In FIG. 25, this basic configuration 2530 is included within a dashed line. The processing units 2510, 2515 execute computer-executable instructions, such as for implementing the features described in Examples 1-12. A processing unit can be a general-purpose central processing unit (CPU), processor in an application-specific integrated circuit (ASIC), a field programmable gate array (FPGA), or any other type of processor, or combination of processors. In a multi-processing system, multiple processing units execute computer-executable instructions to increase processing power. For example, FIG. 25 shows a central processing unit 2510 as well as a graphics processing unit or co-processing unit 2515. The tangible memory 2520, 2525 may be volatile memory (e.g., registers, cache, RAM), non-volatile memory (e.g., ROM, EEPROM, flash memory, etc.), or some combination of the two, accessible by the processing unit(s) 2510, 2515. The memory 2520, 2525 stores software 2580 implementing one or more innovations described herein, in the form of computer-executable instructions suitable for execution by the processing unit(s) 2510, 2515.

A computing system 2500 may have additional features. For example, the computing system 2500 includes storage 2540, one or more input devices 2550, one or more output devices 2560, and one or more communication connections 2570, including input devices, output devices, and communication connections for interacting with a user. An interconnection mechanism (not shown) such as a bus, controller, or network interconnects the components of the computing system 2500. Typically, operating system software (not shown) provides an operating environment for other software executing in the computing system 2500, and coordinates activities of the components of the computing system 2500.

The tangible storage 2540 may be removable or non-removable, and includes magnetic disks, magnetic tapes or cassettes, CD-ROMs, DVDs, or any other medium which can be used to store information in a non-transitory way, and which can be accessed within the computing system 2500. The storage 2540 stores instructions for the software 2580 implementing one or more innovations described herein.

The input device(s) 2550 may be a touch input device such as a keyboard, mouse, pen, or trackball, a voice input device, a scanning device, or another device that provides input to the computing system 2500. The output device(s) 2560 may be a display, printer, speaker, CD-writer, or another device that provides output from the computing system 2500.

The communication connection(s) 2570 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

In various examples described herein, a module (e.g., component or engine) can be "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general purpose program, such as one or more lines of code in a larger or general purpose program.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Example 14—Cloud Computing Environment

Figure 26:
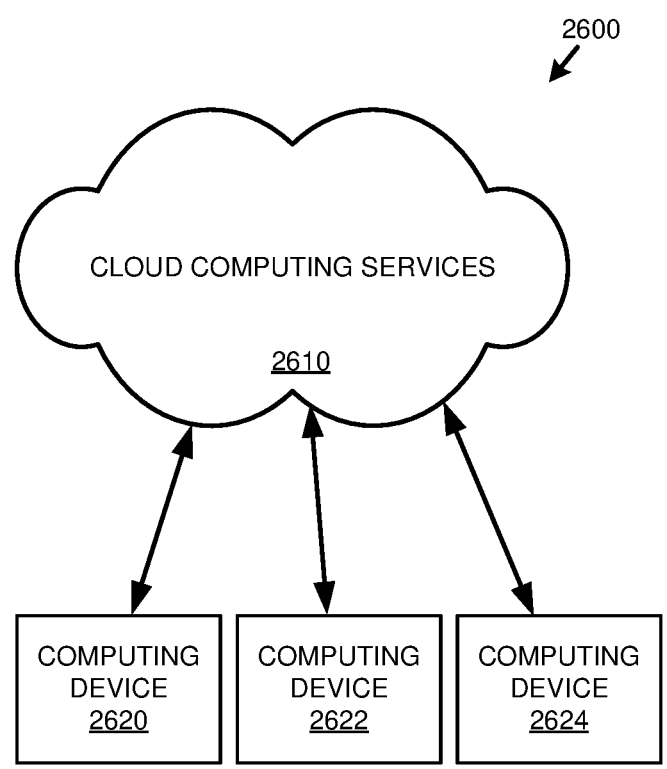
FIG. 26 is an example cloud computing environment that can be used in conjunction with the technologies described herein.

FIG. 26 depicts an example cloud computing environment 2600 in which the described technologies can be implemented. The cloud computing environment 2600 comprises cloud computing services 2610. The cloud computing services 2610 can comprise various types of cloud computing resources, such as computer servers, data storage repositories, networking resources, etc. The cloud computing services 2610 can be centrally located (e.g., provided by a data center of a business or organization) or distributed (e.g., provided by various computing resources located at different locations, such as different data centers and/or located in different cities or countries).

The cloud computing services 2610 are utilized by various types of computing devices (e.g., client computing devices), such as computing devices 2620, 2622, and 2624. For example, the computing devices (e.g., 2620, 2622, and 2624) can be computers (e.g., desktop or laptop computers), mobile devices (e.g., tablet computers or smart phones), or other types of computing devices. For example, the computing devices (e.g., 2620, 2622, and 2624) can utilize the cloud computing services 2610 to perform computing operations (e.g., data processing, data storage, and the like).

Example 15—Implementations

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media and executed on a computing device (e.g., any available computing device, including smart phones or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example and with reference to FIG. 25, computer-readable storage media include memory 2520 and 2525, and storage 2540. The term computer-readable storage media does not include signals and carrier waves. In addition, the term computer-readable storage media does not include communication connections (e.g., 2570).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network, or other such network) using one or more network computers.

For clarity, only certain selected aspects of the software-based implementations are described. It should be understood that the disclosed technology is not limited to any specific computer language or program. For instance, the disclosed technology can be implemented by software written in C++, Java, Perl, JavaScript, Python, Ruby, ABAP, SQL, Adobe Flash, or any other suitable programming language, or, in some examples, markup languages such as html or XML, or combinations of suitable programming languages and markup languages. Likewise, the disclosed technology is not limited to any particular computer or type of hardware.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present, or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Rather, the scope of the disclosed technology includes what is covered by the scope and spirit of the following claims.

What is claimed is:

1. A method, implemented in a computing environment comprising at least one hardware processor and at least one memory coupled to the at least one hardware processor, the method comprising:
   receiving a data set representing a plurality of rows and a first plurality of columns, each column of the first plurality of columns comprising a plurality of data elements of the data set, the plurality of data elements being associated with respective positions in the column;
   placing the first plurality of columns in an order;
   adding columns of a second plurality of columns that includes all or a portion of the first plurality of columns to a first group of one or more columns to be compressed, based at least in part on the order, if (1) a compressed size of a given column of the second plurality of columns is less than an uncompressed size of the given column; or (2) a storage size calculated as the sum of a size of the first group of one or more columns and columns in a second group of one or more columns that are not compressed is smaller than when the given column is included in the second group of columns and is not compressed;
   compressing columns of the first group of one or more columns using a first compression technique; and
   not compressing columns of the second group of one or more columns using the first compression technique.

2. The method of claim 1, wherein the first compression technique comprises a run-length encoding technique.

3. The method of claim 1, wherein the first plurality of columns are compressed using dictionary compression prior to the adding.

4. The method of claim 1, further comprising:
   reordering rows of the table prior to compressing columns in the first group of one or more columns.

5. The method of claim 1, wherein the iteratively adding columns comprises adding columns of the first plurality of columns to the first group until a column is identified whose compressed size is not smaller than its uncompressed size.

6. The method of claim 1, wherein the iteratively adding columns comprises evaluating all columns of the first plurality of columns and adding to the first group columns of the first plurality of columns having a compressed size less than an uncompressed size.

7. The method of claim 1, wherein the iteratively adding columns comprises (2).

8. The method of claim 1, further comprising:
   determining cardinalities for the first plurality of columns, wherein the cardinality of a given column is a number of unique values in the column;
   wherein the placing the first plurality of columns in the order comprises ordering the first plurality of columns by ascending cardinality.

9. A computing system comprising:
one or more memories;
one or more hardware processing units coupled to the one or more memories; and
one or more computer readable storage media storing computer-executable instructions that, when executed, cause the computing system to perform operations comprising:
receiving a first plurality of columns of a data set represented as the first plurality of columns and a plurality of rows, columns of the first plurality of being in a first order, columns of the first plurality of columns comprising a plurality of data elements, where the data elements are associated with positions in the columns of the first plurality of columns and data elements at a particular position within a given column of the first plurality of columns are correlated with data elements of other columns of the first plurality of columns at the given positions of the other columns of the first plurality of columns;
determining a second order for the first plurality of columns, the determining a second order comprising:
determining a correlation value between a first column of the first plurality of columns and a second column of the first plurality of columns;
comparing the correlation value with a threshold;
determining that the correlation value satisfies the threshold;
based on determining that the correlation value satisfies the threshold, adding the second column to a group comprising the first column;
reordering data elements of the first plurality of columns using the second order;
adding columns of a second plurality of columns that includes all or a portion of the first plurality of columns to a first group of one or more columns to be compressed, based at least in part on the order, if (1) a compressed size of a given column of the second plurality of columns is less than an uncompressed size of the given column; or (2) a storage size calculated as the sum of a size of the first group of one or more columns and columns in a second group of one or more columns that are not compressed is smaller than when the given column is included in the second group of columns and is not compressed;
compressing columns of the first group of one or more columns using a first compression technique; and
not compressing columns of the second group of one or more columns using the first compression technique.

10. The computing system of claim 9, the operations further comprising:
determining cardinalities for the first column and the second column, wherein the cardinality of a given column is a number of unique values in the given column; and
ordering the first column and the second column within the group by ascending cardinality.

11. The computing system of claim 10, wherein the data set comprises a third column that is not part of the group, the operations further comprising:
determining a cardinality of the third column; and
ordering the third column relative to the group by ascending cardinality based on a column of the group having a lowest cardinality for the group.

12. The computing system of claim 9, the operations further comprising:
determining cardinalities for the first column and the second column, wherein the cardinality of a given column is a number of unique values in the given column;
determining the floor values of the logarithms of the cardinalities of the first column and the second column;
determining that the floor value of the first column is not equal to the floor value of the of the second column; and
removing the first column from the group.

13. The computing system of claim 9, the operations further comprising:
determining a first compressed data set size for the column using a first compression technique;
determining a second compressed data set size for the second column using the first compression technique; and
ordering the first column and the second column within the group by ascending compressed column size.

14. The computing system of claim 9, wherein the columns of the first plurality of columns are dictionary compressed prior to the determining a second order.

15. The computing system of claim 9, wherein compressing data elements of at least a portion of the first plurality of columns comprises compressing data elements using a run-length encoding technique.

16. A computing system comprising:
one or more memories;
one or more hardware processing units coupled to the one or more memories; and
one or more computer readable storage media storing computer-executable instructions that, when executed, cause the computing system to perform operations comprising:
receiving a request for a first data element value of a data set comprising a plurality of data elements;
determining a first position group comprising a plurality of data element positions that comprises a position of a first data element having the first data element value;
determining a first logical pointer value specified for the first position group;
dereferencing the first logical pointer value to a first data structure comprising data element positions and data values;
identifying the position of the first data element in the first data structure;
determining the first data element value specified in the first data structure for the first data element; and
returning the first data element value in response to the request.

17. The computing system of claim 16, wherein the data structure comprises run-length encoding information comprising an array of value IDs and array of run-lengths.

18. The computing system of claim 16, wherein the first data element comprises a row position of a table, wherein the data set corresponds to a column of the table.

19. The computing system of claim 16, wherein the first position group and the first logical pointer value are stored in a second data structure, wherein the first pointer value references the first data structure.

20. The computing system of claim 19, wherein the second data structure stores a plurality of position groups and a plurality of logical pointer values.

21. One or more non-transitory computer-readable storage media comprising:
  computer-executable instructions that, when executed by a computing system comprising at least one hardware processor and at least one memory coupled to the at least one hardware processor, cause the computing system to receive a data set representing a plurality of rows and a first plurality of columns, each column of the first plurality of columns comprising a plurality of data elements of the data set, the plurality of data elements being associated with respective positions in the column;
  computer-executable instructions that, when executed by the computing system, cause the computing system to place the first plurality of columns in an order;
  computer-executable instructions that, when executed by the computing system, cause the computing system to add columns of a second plurality of columns that includes all or a portion of the first plurality of columns to a first group of one or more columns to be compressed, based at least in part on the order, if (1) a compressed size of a given column of the second plurality of columns is less than an uncompressed size of the given column; or (2) a storage size calculated as the sum of a size of the first group of one or more columns and columns in a second group of one or more columns that are not compressed is smaller than when the given column is included in the second group of columns and is not compressed;
  computer-executable instructions that, when executed by the computing system, cause the computing system to compress columns of the first group of one or more columns using a first compression technique; and
  computer-executable instructions that, when executed by the computing system, cause the computing system to not compress columns of the second group of one or more columns using the first compression technique.

22. The one or more non-transitory computer-readable storage media of claim 21, wherein the first compression technique comprises a run-length encoding technique.

23. The one or more non-transitory computer-readable storage media of claim 21, wherein the first plurality of columns are compressed using dictionary compression prior to the adding columns of a second plurality of columns.

24. The one or more non-transitory computer-readable storage media of claim 21, further comprising:
  computer-executable instructions that, when executed by the computing system, cause the computing system to reorder rows of the table prior to compressing columns in the first group of one or more columns.

25. The one or more non-transitory computer-readable storage media of claim 21, wherein the iteratively adding columns comprises computer-executable instructions that, when executed by the computing system, cause the computing system to add columns of the first plurality of columns to the first group until a column is identified whose compressed size is not smaller than its uncompressed size.

26. The one or more non-transitory computer-readable storage media of claim 21, wherein the iteratively adding columns comprises computer-executable instructions that, when executed by the computing system, cause the computing system to evaluate all columns of the first plurality of columns and adding to the first group columns of the first plurality of columns having a compressed size less than an uncompressed size.

27. The one or more non-transitory computer-readable storage media of claim 21, wherein the iteratively adding columns comprises (2).

28. The one or more non-transitory computer-readable storage media of claim 21, further comprising:
  computer-executable instructions that, when executed by the computing system, cause the computing system to determine cardinalities for the first plurality of columns, wherein the cardinality of a given column is a number of unique values in the column;
  wherein the placing the first plurality of columns in the order comprises computer-executable instructions that, when executed by the computing system, cause the computing system to order the first plurality of columns by ascending cardinality.

29. One or more non-transitory computer-readable storage media comprising:
  computer-executable instructions that, when executed by a computing system comprising at least one hardware processor and at least one memory coupled to the at least one hardware processor, cause the computing system to receive a first plurality of columns of a data set represented as the first plurality of columns and a plurality of rows, columns of the first plurality of being in a first order, columns of the first plurality of columns comprising a plurality of data elements, where the data elements are associated with positions in the columns of the first plurality of columns and data elements at a particular position within a given column of the first plurality of columns are correlated with data elements of other columns of the first plurality of columns at the given positions of the other columns of the first plurality of columns;
  computer-executable instructions that, when executed by the computing system, cause the computing system to determine a second order for the first plurality of columns, the computer-executable instructions that cause the computing system to determine a second order comprising:
    computer-executable instructions that, when executed by the computing system, cause the computing system to determine a correlation value between a first column of the first plurality of columns and a second column of the first plurality of columns;
    computer-executable instructions that, when executed by the computing system, cause the computing system to compare the correlation value with a threshold;
    computer-executable instructions that, when executed by the computing system, cause the computing system to determine that the correlation value satisfies the threshold;
    computer-executable instructions that, when executed by the computing system, cause the computing system to, based on determining that the correlation value satisfies the threshold, add the second column to a group comprising the first column;
  computer-executable instructions that, when executed by the computing system, cause the computing system to reorder data elements of the first plurality of columns using the second order;
  computer-executable instructions that, when executed by the computing system, cause the computing system to add columns of a second plurality of columns that includes all or a portion of the first plurality of columns to a first group of one or more columns to be compressed, based at least in part on the order, if (1) a compressed size of a given column of the second plurality of columns is less than an uncompressed size of the given column; or (2) a storage size calculated as the sum of a size of the first group of one or more columns and columns in a second group of one or more columns that are not compressed is smaller than when the given column is included in the second group of columns and is not compressed;

computer-executable instructions that, when executed by the computing system, cause the computing system to compress columns of the first group of one or more columns using a first compression technique; and computer-executable instructions that, when executed by the computing system, cause the computing system to not compress columns of the second group of one or more columns using the first compression technique.

30. The one or more non-transitory computer-readable storage media of claim 29, further comprising:

computer-executable instructions that, when executed by the computing system, cause the computing system to determine cardinalities for the first column and the second column, wherein the cardinality of a given column is a number of unique values in the given column; and computer-executable instructions that, when executed by the computing system, cause the computing system to order the first column and the second column within the group by ascending cardinality.

31. The one or more non-transitory computer-readable storage media of claim 30, wherein the data set comprises a third column that is not part of the group, further comprising:

computer-executable instructions that, when executed by the computing system, cause the computing system to determine a cardinality of the third column; and computer-executable instructions that, when executed by the computing system, cause the computing system to order the third column relative to the group by ascending cardinality based on a column of the group having a lowest cardinality for the group.

32. The one or more non-transitory computer-readable storage media of claim 29, further comprising:

computer-executable instructions that, when executed by the computing system, cause the computing system to determine cardinalities for the first column and the second column, wherein the cardinality of a given column is a number of unique values in the given column;

computer-executable instructions that, when executed by the computing system, cause the computing system to determine the floor values of the logarithms of the cardinalities of the first column and the second column;

computer-executable instructions that, when executed by the computing system, cause the computing system to determine that the floor value of the first column is not equal to the floor value of the of the second column; and computer-executable instructions that, when executed by the computing system, cause the computing system to remove the first column from the group.

33. The one or more non-transitory computer-readable storage media of claim 29, further comprising:

computer-executable instructions that, when executed by the computing system, cause the computing system to determine a first compressed data set size for the column using a first compression technique;

computer-executable instructions that, when executed by the computing system, cause the computing system to determine a second compressed data set size for the second column using the first compression technique; and computer-executable instructions that, when executed by the computing system, cause the computing system to order the first column and the second column within the group by ascending compressed column size.

34. The one or more non-transitory computer-readable storage media of claim 29, wherein the columns of the first plurality of columns are dictionary compressed prior to the determining a second order.

35. The one or more non-transitory computer-readable storage media of claim 29, wherein compressing data elements of at least a portion of the first plurality of columns comprises computer-executable instructions that, when executed by the computing system, cause the computing system to compress data elements using a run-length encoding technique.

36. A method, implemented in a computing environment comprising at least one hardware processor and at least one memory coupled to the at least one hardware processor, the method comprising:

receiving a request for a first data element value of a data set comprising a plurality of data elements;

determining a first position group comprising a plurality of data element positions that comprises a position of a first data element having the first data element value;

determining a first logical pointer value specified for the first position group;

dereferencing the first logical pointer value to a first data structure comprising data element positions and data values;

identifying the position of the first data element in the first data structure;

determining the first data element value specified in the first data structure for the first data element; and returning the first data element value in response to the request.

37. The method of claim 36, wherein the data structure comprises run-length encoding information comprising an array of value IDs and array of run-lengths.

38. The method of claim 36, wherein the first data element comprises a row position of a table, wherein the data set corresponds to a column of the table.

39. The method of claim 36, wherein the first position group and the first logical pointer value are stored in a second data structure, wherein the first pointer value references the first data structure.

40. The method of claim 39, wherein the second data structure stores a plurality of position groups and a plurality of logical pointer values.

\* \* \* \* \*